United States Patent
Hanzawa

(10) Patent No.: US 10,403,672 B2
(45) Date of Patent: Sep. 3, 2019

(54) SOLID-STATE IMAGING DEVICE WITH PIXELS HAVING FIRST AND SECOND PHOTOELECTRIC CONVERSION UNITS, DRIVING METHOD THEREFOR, AND ELECTRONIC APPARATUS

(71) Applicant: SONY CORPORATION, Tokyo (JP)

(72) Inventor: Katsuhiko Hanzawa, Kanagawa (JP)

(73) Assignee: Sony Corporation, Tokyo (JP)

(*) Notice: Subject to any disclaimer, the term of this patent is extended or adjusted under 35 U.S.C. 154(b) by 156 days.

(21) Appl. No.: 14/889,947

(22) PCT Filed: Mar. 4, 2015

(86) PCT No.: PCT/JP2015/001142
§ 371 (c)(1),
(2) Date: Nov. 9, 2015

(87) PCT Pub. No.: WO2014/141161
PCT Pub. Date: Sep. 24, 2015

(65) Prior Publication Data
US 2016/0141326 A1   May 19, 2016

(30) Foreign Application Priority Data
Mar. 17, 2014  (JP) .................. 2014-053667

(51) Int. Cl.
*H04N 5/3745*  (2011.01)
*H01L 27/146*  (2006.01)

(52) U.S. Cl.
CPC .... *H01L 27/14641* (2013.01); *H01L 27/1461* (2013.01); *H01L 27/1464* (2013.01);
(Continued)

(58) Field of Classification Search
CPC ............... H04N 5/347; H04N 5/3745; H04N 5/37457; H04N 5/3559; H04N 5/37452; H01L 27/14641
See application file for complete search history.

(56) References Cited

U.S. PATENT DOCUMENTS

2002/0148946 A1* 10/2002 Tu .................. H01L 27/14618
250/208.1
2006/0274176 A1* 12/2006 Guidash ............ H01L 27/14643
348/300
(Continued)

FOREIGN PATENT DOCUMENTS

CN   101213829   7/2008
CN   101854488   10/2010
(Continued)

OTHER PUBLICATIONS

Official Action (no English translation available) for Japanese Patent Application No. 2014-053667 dated Aug. 23, 2016, 7 pages.
(Continued)

Primary Examiner — Thanh Luu
(74) Attorney, Agent, or Firm — Sheridan Ross P.C.

(57) ABSTRACT

A pixel in which both phase difference detection and image generation are performed can be implemented with a more simple structure. Each of a plurality of pixels two-dimensionally arranged in a matrix shape includes a first photoelectric conversion unit and a second photoelectric conversion unit both configured to photoelectrically convert light entering via one micro lens. A first reading circuit reads an electric charge generated at the first photoelectric conversion unit and a second reading circuit reads an electric charge generated at the second photoelectric conversion unit. A transistor connects a first electric charge holding unit included in the first reading circuit to a second electric charge holding unit included in the second reading circuit.

(Continued)

The present technology is applicable to, for example, a solid-state imaging device that detects a phase difference.

13 Claims, 18 Drawing Sheets

(52) U.S. Cl.
CPC .. *H01L 27/14603* (2013.01); *H01L 27/14612* (2013.01); *H01L 27/14627* (2013.01); *H01L 27/14636* (2013.01); *H01L 27/14643* (2013.01); *H04N 5/3745* (2013.01)

(56) References Cited

U.S. PATENT DOCUMENTS

| | | | | |
|---|---|---|---|---|
| 2009/0215221 A1* | 8/2009 | Yoo | H01L 27/14609 | 438/97 |
| 2010/0238330 A1* | 9/2010 | Hirota | H01L 27/14621 | 348/273 |
| 2012/0312964 A1* | 12/2012 | Yamashita | H04N 5/37457 | 250/208.1 |
| 2013/0182158 A1* | 7/2013 | Kobayashi | H01L 31/02 | 348/294 |
| 2013/0222552 A1* | 8/2013 | Agranov | H04N 13/0203 | 348/49 |
| 2014/0061436 A1 | 3/2014 | Kobayashi | | |
| 2014/0232914 A1* | 8/2014 | Awatani | H04N 5/378 | 348/302 |

FOREIGN PATENT DOCUMENTS

| | | |
|---|---|---|
| JP | 2001-083407 | 3/2001 |
| JP | 2001-250931 | 9/2001 |
| JP | 2007 243744 A | 9/2007 |
| JP | 2010-193437 | 9/2010 |
| JP | 2012-501578 | 1/2012 |
| JP | 2013-157883 | 8/2013 |
| JP | 2013-172210 | 9/2013 |

OTHER PUBLICATIONS

International Search Report and Written Opinion prepared by the European Patent Office dated Jun. 23, 2015, for International Application No. PCT/JP2015/001142.

Official Action (with English translation) for Japanese Patent Application No. 201580000727.2, dated Sep. 30, 2018, 20 pages.

* cited by examiner

SOLID-STATE IMAGING DEVICE WITH PIXELS HAVING FIRST AND SECOND PHOTOELECTRIC CONVERSION UNITS, DRIVING METHOD THEREFOR, AND ELECTRONIC APPARATUS

TECHNICAL FIELD

The present disclosure relates to a solid-state imaging device, a driving method therefor, and an electronic apparatus, and particularly relates the solid-state imaging device, the driving method therefor, and the electronic apparatus, capable of implementing a pixel in which both phase difference detection and image generation can be performed.

CROSS REFERENCE TO RELATED APPLICATIONS

This application is a national stage application under 35 U.S.C. 371 and claims the benefit of PCT Application No. PCT/JP2015/001142 having an international filing date of Mar. 4, 2015, which designated the United States, which PCT application claimed the benefit of Japanese Patent Application No. 2014-053667 filed Mar. 17, 2014, the disclosures of which are incorporated herein by reference in their entirety.

BACKGROUND ART

As a focus adjusting method in an imaging device, focus detection by a phase difference system and a contrast system is known. According to the phase difference system, the focus can be adjusted with high-speed, but it is necessary that a sensor to detect a phase difference is separately from an image detection sensor. On the other hand, according to the contrast system, a focus is adjusted by moving a focus position forward and backward and evaluating a signal from an imaging element by use of a function. Since the focus position can be detected by the imaging element, it is not necessary to provide a sensor separately from the image detection sensor, and therefore, the imaging device can be easily downsized. However, there is a demerit that a focus speed may be slow.

Considering this, an image surface phase difference system is proposed, in which a pixel configured to detect a focus by the phase difference system is embedded in an imaging element (for example, refer to PTLs 1 to 3).

For instance, PTL 1 discloses a configuration in which a focus detecting pixel formed by partly shielding the pixel from light is provided at a predetermined position inside the imaging element. According to the method of PTL 1, while accuracy of focus detection is high, a defective pixel is generated because it is difficult to use a signal of the focus detecting pixel to generate an image. Further, high-density arrangement of the focus detecting pixels may contradict defect density.

On the other hand, PTL 2 discloses a configuration in which two divided photoelectric conversion units are included inside one pixel. The accuracy of focus detection in a single pixel is lower than the accuracy of focus detection by partly shielding light, but in the case of utilizing the configuration to generate an image, no defective pixel is generated because it is only to read a combined signal of both photoelectric conversion units.

According to the configuration in PTL 2, the signals from the two photoelectric conversion units inside one pixel are combined when utilized to generate the image, and therefore, the two photoelectric conversion units inside the one pixel are connected to one floating diffusion (FD) unit. Since capacity of the FD unit is optimized for the two photoelectric conversion units, a signal amount becomes reduced and an S/N ratio may be deteriorated in the case of detecting the focus in the case of using only one of the photoelectric conversion units. In contrast, when the capacity of the FD unit is optimized for one of the photoelectric conversion units at the time of detecting the focus, a dynamic range is reduced and the pixel signal corresponding to a received light amount may not be received.

Additionally, according to any one of the pixel configurations of PTLs 1 and 2, the signal may be obtained from only one photoelectric conversion unit inside one pixel at the time of detecting the focus. Considering this, there is a technology in which a memory unit is provided in each of the two photoelectric conversion units inside one pixel (for example, refer to PTL 3).

CITATION LIST

Patent Literature

PTL 1: JP 2013-157883 A
PTL 2: JP 2001-83407 A
PTL 3: JP 2007-243744 A

SUMMARY OF INVENTION

Technical Problem

However, in the case where the memory unit is provided in each of the two photoelectric conversion units inside one pixel, a circuit size may be enlarged.

The present disclosure is made in consideration of the above-described circumstances, and directed to implement a pixel in which both phase difference detection and image generation be performed with a more simple structure.

Solution to Problem

A solid-state imaging device according to a first aspect of the present disclosure, in which each of a plurality of pixels two-dimensionally arranged in a matrix shape includes a first photoelectric conversion unit and a second photoelectric conversion unit both configured to photoelectrically convert light entering via one micro lens, includes: a first reading circuit configured to read an electric charge generated at the first photoelectric conversion unit; a second reading circuit configured to read an electric charge generated at the second photoelectric conversion unit; and a transistor configured to connect a first electric charge holding unit included in the first reading circuit to a second electric charge holding unit included in the second reading circuit.

In a driving method for a solid-state imaging device according to a second aspect of the present disclosure, the solid-state imaging device has each of a plurality of pixels two-dimensionally arranged in a matrix shape and including a first photoelectric conversion unit and a second photoelectric conversion unit both configured to photoelectrically convert light entering via one micro lens, and includes: a first reading circuit configured to read an electric charge generated at the first photoelectric conversion unit; a second reading circuit configured to read an electric charge generated at the second photoelectric conversion unit; and a transistor configured to connect a first electric charge holding unit included in the first reading circuit to a second electric charge holding unit included in the second reading circuit, and the transistor connects the first electric charge holding unit to the second electric charge holding unit in the case of using the pixel as an image generating pixel, and the transistor separates the first electric charge holding unit from the second electric charge holding unit in the case of using the pixel as a focus detecting pixel.

An electronic apparatus according to a third aspect of the present disclosure includes a solid-state imaging device in which each of a plurality of pixels two-dimensionally arranged in a matrix shape includes a first photoelectric conversion unit and a second photoelectric conversion unit both configured to photoelectrically convert light entering via one micro lens, and the solid-state imaging device includes: a first reading circuit configured to read an electric charge generated at the first photoelectric conversion unit; a second reading circuit configured to read an electric charge generated at the second photoelectric conversion unit; and a transistor configured to connect a first electric charge holding unit included in the first reading circuit to a second electric charge holding unit included in the second reading circuit.

According to the first to third aspects of the present disclosure, each of the plurality of pixels two-dimensionally arranged in a matrix shape includes the first photoelectric conversion unit and the second photoelectric conversion unit both configured to photoelectrically convert light entering via one micro lens, an electric charge generated at the first photoelectric conversion unit is read by a first reading circuit, an electric charge generated at the second photoelectric conversion unit is read by a second reading circuit, and the first electric charge holding unit included in the first reading circuit and the second electric charge holding unit included in the second reading circuit are connected by the transistor.

The solid-state imaging device and the electronic apparatus may be formed of independent devices or may be modules incorporated to a different device.

Advantageous Effects of Invention

According to the first to third aspects of the present disclosure, a pixel in which both phase difference detection and image generation are performed can be implemented with a more simple structure.

Note that the effects recited here are not limited thereto and may be any one of the effects recited within the present disclosure.

DESCRIPTION OF EMBODIMENTS

Embodiments to carry out the present disclosure (hereafter referred to as embodiments) will be described. Note that a description will be provided in the following order.

1. Exemplary Schematic Configuration of Solid-State Imaging Device

2. Pixel Circuit Configuration According to First Embodiment (First Configuration Laterally Connecting FD Units)

3. Pixel Circuit Configuration According to Second Embodiment (Second Configuration Laterally Connecting FD Units)

4. Pixel Circuit Configuration According to Third Embodiment (First Configuration Vertically Connecting FD Units)

5. Pixel Circuit Configuration According to Fourth Embodiment (Second Configuration Vertically Connecting FD Units)

6. Pixel Circuit Configuration According to Fifth Embodiment (First Configuration Vertically and Laterally Connecting FD Units)

7. Pixel Circuit Configuration According to Sixth Embodiment (Configuration Having Reading Circuit Shared by Four Pixels)

8. Exemplary Application to Electronic Apparatus

<1. Exemplary Schematic Configuration of Solid-State Imaging Device>

Figure 1:
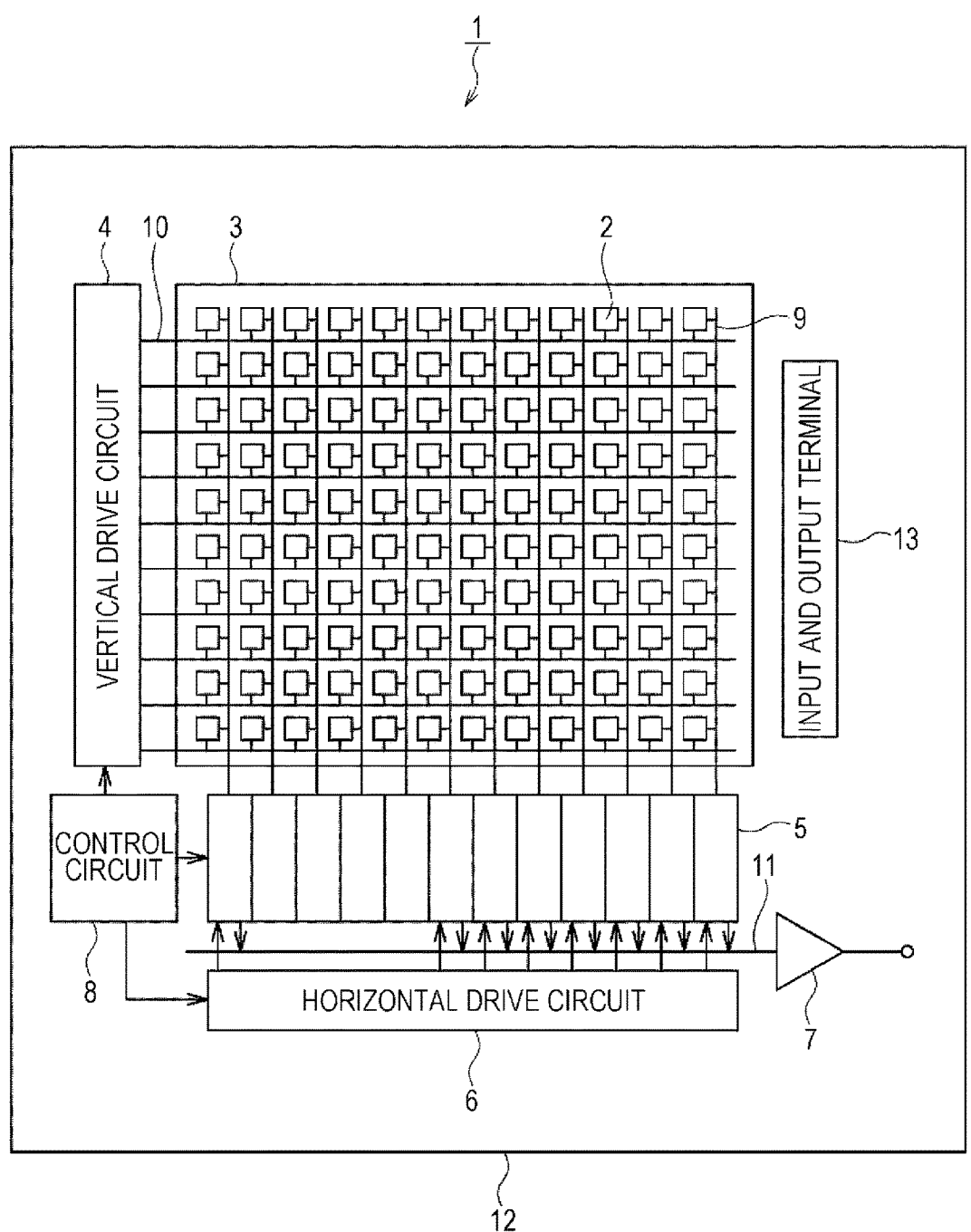
FIG. 1 is a diagram illustrating a schematic configuration of a solid-state imaging device according to an embodiment of the present disclosure.

FIG. 1 is a diagram illustrating a schematic configuration of a solid-state imaging device according to an embodiment of the present disclosure.

A solid-state imaging device 1 in FIG. 1 is includes, as a semiconductor, a semiconductor substrate 12 using silicon (Si), for example, on which a pixel array unit 3 where pixels 2 are arranged in a two-dimensional array and a peripheral circuit unit in a periphery are provided. The peripheral circuit unit includes, for example, a vertical drive circuit 4, a column signal processing circuit 5, a horizontal drive circuit 6, an output circuit 7, and a control circuit 8.

The control circuit 8 receives data to command an input clock, an operation mode, and the like, and also outputs data such as internal information of the solid-state imaging device 1. More specifically, the control circuit 8 generates a clock signal and a control signal to be a basis of operation of the vertical drive circuit 4, column signal processing circuit 5, horizontal drive circuit 6, etc. based on a vertical synchronization signal, a horizontal synchronization signal, and a master clock. Further, the control circuit 8 outputs the generated clock signal and control signal to the vertical drive circuit 4, column signal processing circuit 5, horizontal drive circuit 6, and so on.

The vertical drive circuit 4 is formed of, for example, a shift register, and selects a predetermined pixel drive wire 10 and supplies a pulse to the selected pixel drive wire 10 to drive the pixels 2, thereby driving the pixels 2 per row. More specifically, the vertical drive circuit 4 selectively scans, per row, respective pixels 2 of the pixel array unit 3 sequentially in the vertical direction, and the column signal processing circuit 5 is made to supply, via a vertical signal line 9, a pixel signal based on a signal electric charge generated at a photoelectric conversion unit of each pixel 2 in accordance with a received light amount.

The column signal processing circuit 5 is disposed in each column of the pixel 2 and applies, per pixel column, signal processing such as noise removal to the signals output from the pixels 2 included in one row. For example, the column signal processing circuit 5 applies the signal processing such as Correlated Double Sampling (CDS) to remove fixed pattern noise unique to the pixel, and AD conversion.

The horizontal drive circuit 6 is formed of, for example, a shift register and sequentially outputs horizontal scanning pulses, thereby sequentially selecting each of the column signal processing circuits 5 and causing each of the column signal processing circuits 5 to output a pixel signal to a horizontal signal line 11.

The output circuit 7 applies signal processing to the signals sequentially supplied from the respective column signal processing circuits 5 via the horizontal signal line 11, and outputs the signals. The output circuit 7 may apply, for example, just buffering, and may apply black level adjustment, column variations correction, various kinds of digital signal processing, etc. An input and output terminal 13 exchanges signals with the outside.

The solid-state imaging device 1 configured as described above is a CMOS image sensor called column A/D system, in which the column signal processing circuit 5 configured to execute the CDS processing and A/D conversion processing is arranged per pixel column.

<Basic Circuit of Present Pixel Circuit>

Next, a pixel circuit inside the pixel array unit 3 of the solid-state imaging device 1 will be described. However, before that, a circuit configuration of a basic pixel to be a basis of the pixel circuit according to an embodiment of the present embodiment will be described.

Figure 2:
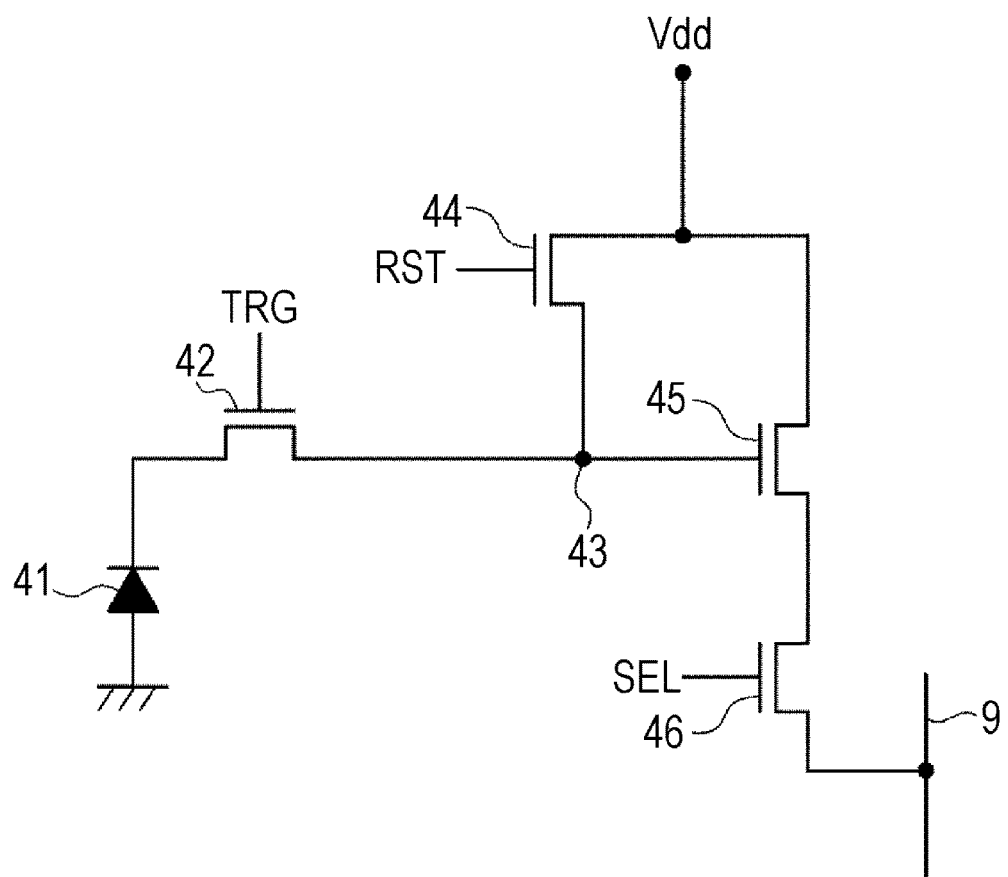
FIG. 2 is a diagram illustrating an exemplary circuit configuration of a basic pixel.

FIG. 2 is a diagram illustrating an exemplary circuit configuration of the basic pixel.

The basic pixel includes a photodiode 41 as a photoelectric conversion unit, a transfer transistor 42, a floating diffusion (FD) unit 43, a reset transistor 44, an amplification transistor 45, and a selecting transistor 46.

The photodiode 41 generates an electric charge (signal electric charge) in accordance with a received light amount and accumulates the electric charge. The photodiode 41 has an anode terminal grounded and a cathode terminal connected to the FD unit 43 via the transfer transistor 42.

The transfer transistor 42 reads the electric charge generated at the photodiode 41 when a transfer signal TRG is turned on, and transfers the electric charge to the FD unit 43.

The FD unit 43 holds the electric charge read from the photodiode 41. The reset transistor 44 resets electrical potential of the FD unit 43 when a reset signal RST is turned on and the electric charge accumulated in the FD unit 43 is discharged to a drain (constant voltage source Vdd).

The amplification transistor 45 outputs a pixel signal corresponding to the electrical potential of the FD unit 43. More specifically, the amplification transistor 45 constitutes a source follower circuit together with a load MOS (not illustrated) as a constant current source connected via the vertical signal line 9, and a pixel signal indicating a level corresponding to the electric charge accumulated in the FD unit 43 is output from the amplification transistor 45 to the vertical signal line 9 via the selecting transistor 46.

The selecting transistor 46 is turned on when a basic pixel is selected by a select signal SEL, and outputs the pixel signal of the basic pixel to the column signal processing circuit 5 via the vertical signal line 9. Respective control lines through which the transfer signal TRG, select signal SEL, and reset signal RST are transmitted correspond to the pixel drive wires 10 in FIG. 1.

As described above, generally, each pixel includes each of the transfer transistor 42, FD unit 43, reset transistor 44, amplification transistor 45, and selecting transistor 46 with respect to one photodiode 41.

<2. Pixel Circuit Configuration According to First Embodiment>

Figure 3:
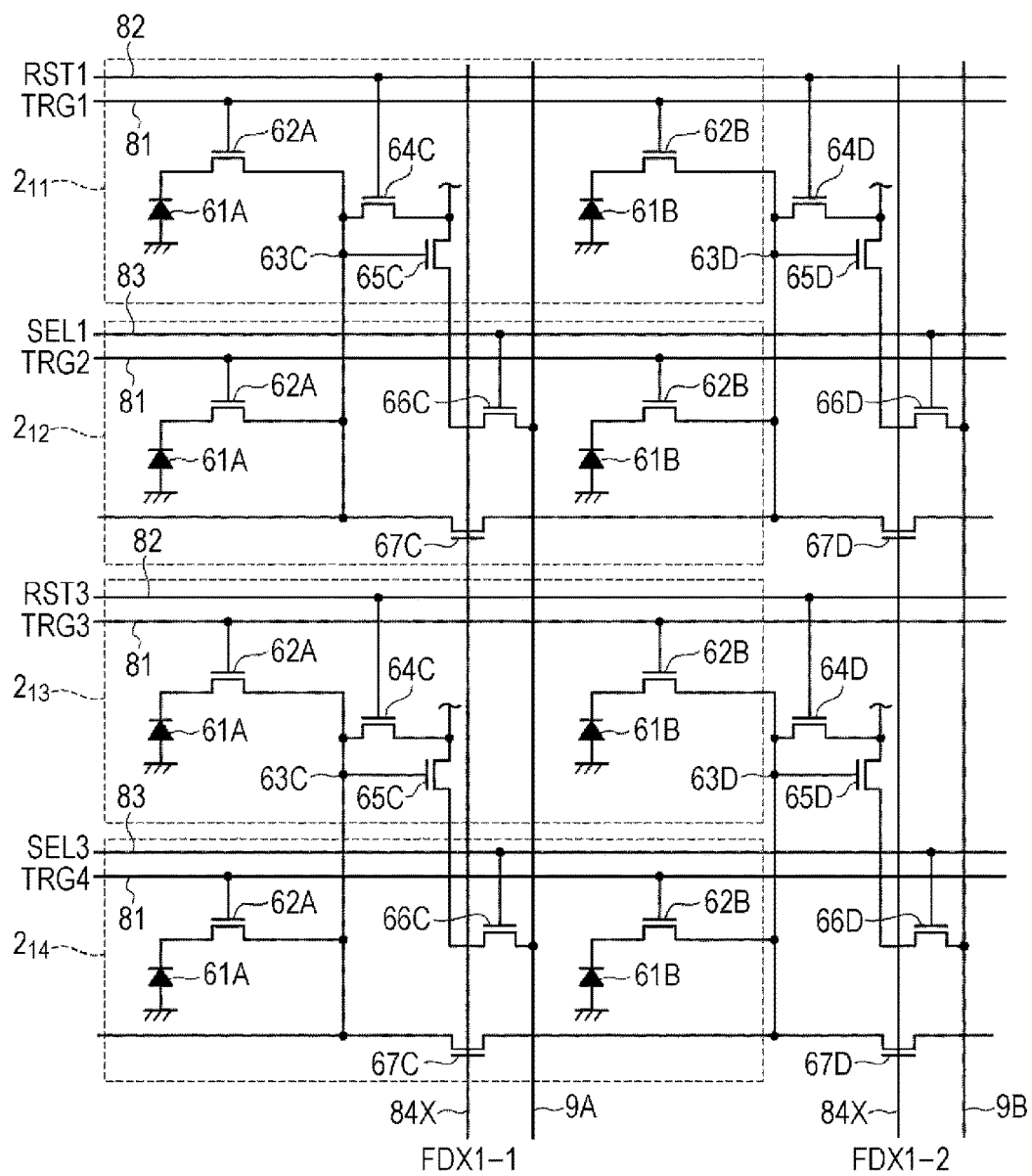
FIG. 3 is a diagram illustrating a first pixel circuit configuration in a pixel array unit of the solid-state imaging device.

In contrast, FIG. 3 is a diagram illustrating a first pixel circuit configuration in a pixel array unit 3 of the solid-state imaging device 1.

According to the pixel array unit 3 in FIG. 3, two of photodiodes 61 and transfer transistors 62 disposed adjacent vertically in the drawing share a reading circuit formed of an FD unit 63, a reset transistor 64, an amplification transistor 65, and a selecting transistor 66. Capacity of the FD unit 63 is set to an electric charge amount obtainable by one photodiode 61, for example.

Further, in the pixel array unit 3 of FIG. 3, an FD connecting transistor 67 is disposed so as to connect respective FD units 63 laterally arrayed (row direction) in the drawing.

The two photodiodes 61 laterally adjacent and surrounded by a dotted line in the drawing are included inside one pixel 2. More specifically, the pixel circuit of the solid-state imaging device 1 has a configuration in which the two photodiodes 61 are disposed in each pixel 2, and connection between the two FD units 63 holding the electric charges generated at the two photodiodes 61 is turned on/off by the FD connecting transistor 67.

In FIG. 3, the two photodiodes 61 disposed inside one pixel and the transfer transistors are respectively differentiated as a photodiode 61A and transfer transistor 62A, and a photodiode 61B and a transfer transistor 62B.

Further, each one of the FD unit 63, reset transistor 64, amplification transistor 65, selecting transistor 66, and FD connecting transistor 67 respectively shared by the vertically adjacent two photodiodes 61A and the transfer transistors 62A are respectively defined as an FD unit 63C, a reset transistor 64C, an amplification transistor 65C, a selecting transistor 66C, and an FD connecting transistor 67C.

Further, each one of the FD unit 63, reset transistor 64, amplification transistor 65, selecting transistor 66, and FD connecting transistor 67 respectively shared by the vertically adjacent two photodiodes 61B and the transfer transistors 62B are defined respectively as an FD unit 63D, a reset transistor 64D, an amplification transistor 65D, a selecting transistor 66D, and an FD connecting transistor 67D.

The photodiode 61, transfer transistor 62, FD unit 63, reset transistor 64, amplification transistor 65, and selecting transistor 66 have functions same as the functions of the above-described photodiode 41, transfer transistor 42, FD unit 43, reset transistor 44, amplification transistor 45, and selecting transistor 46 of the basic pixel.

In the transfer transistor 62, one transfer control line 81 is disposed per one pixel row along the row direction, and the transfer signal TRG is supplied to the transfer transistor 62 via the transfer control line 81. In the reset transistor 64, one reset control line 82 is disposed per two pixel rows along the row direction, and the reset signal RST is supplied to the reset transistor 64 via the reset control line 82. In the selecting transistor 66, one select control line 83 is disposed per two pixel rows along the row direction, and the select signal SEL is supplied to the selecting transistor 66 via the select control line 83.

In the FD connecting transistor 67, two FD connection control lines 84X are disposed per pixel column along a column direction, and an FD connection signal FDX is supplied to the FD connecting transistor 67 via the FD connection control lines 84X. Two of the vertical signal lines 9 are also disposed, corresponding to the two photodiodes 61 in one pixel.

In FIG. 3, four pixels $2_{11}$ to $2_{14}$ located at four rows of a first column at an upper left corner of the pixel array unit 3 are illustrated, and the transfer signals TRG to be supplied to the transfer transistors 62 in the respective pixel rows inside the pixel array unit 3 are differentiated as transfer signals TRG1, TRG2, TRG3, TRG4, . . . , corresponding to the array of the pixels 2.

As for the reset transistors 64 and the selecting transistors 66 included inside the pixel array unit 3, one in each thereof is disposed with respect to the two photodiodes 61A adjacent vertically. Therefore, the reset signals RST and the select signals SEL respectively supplied to the respective reset transistors 64 and selecting transistors 66 are differentiated as reset signals RST1, RST3, (RST5) . . . and select signal SEL1, SEL3, (SEL5), and so on.

The two FD connecting transistors 67 included inside the pixel array unit 3 are respectively disposed in the lateral direction in every pixel, and therefore, the FD connection signals FDX supplied to the respective FD connecting transistors 67 are differentiated as the FD connection signals FDX1-1, FDX1-2, (FDX2-1), (FDX2-2), and so on.

The two of the vertical signal lines 9 are disposed per pixel, corresponding to the two reading circuits, and therefore, the vertical signal lines are differentiated as the vertical signal lines 9A and 9B.

For example, among the four pixels $2_{11}$ to $2_{14}$, in the case of using the pixel $2_{12}$ as the focus detecting pixel, the FD connecting transistor 67C located between the two FD units 63C and 63D holding the electric charges generated by the two photodiodes 61A and 61B disposed inside one pixel is turned off by the FD connection signal FDX 1-1. As a result, the two FD units 63C and 63D are separated.

On the other hand, in the case of using the pixel $2_{12}$ as an image generating pixel, the FD connecting transistor 67C located between the FD units 63C and 63D holding the electric charges generated by the two photodiodes 61A and 61B disposed inside one pixel is turned on by the FD connection signal FDX 1-1. As a result, the two FD units 63C and 63D are connected.

The FD connecting transistor 67D can be connected to the FD unit 63C (not illustrated) in an adjacent pixel $2_{22}$ in the case where the pixel $2_{12}$ is used as the focus detecting pixel and the capacity for the photodiode 61B is variable.

Figure 5:
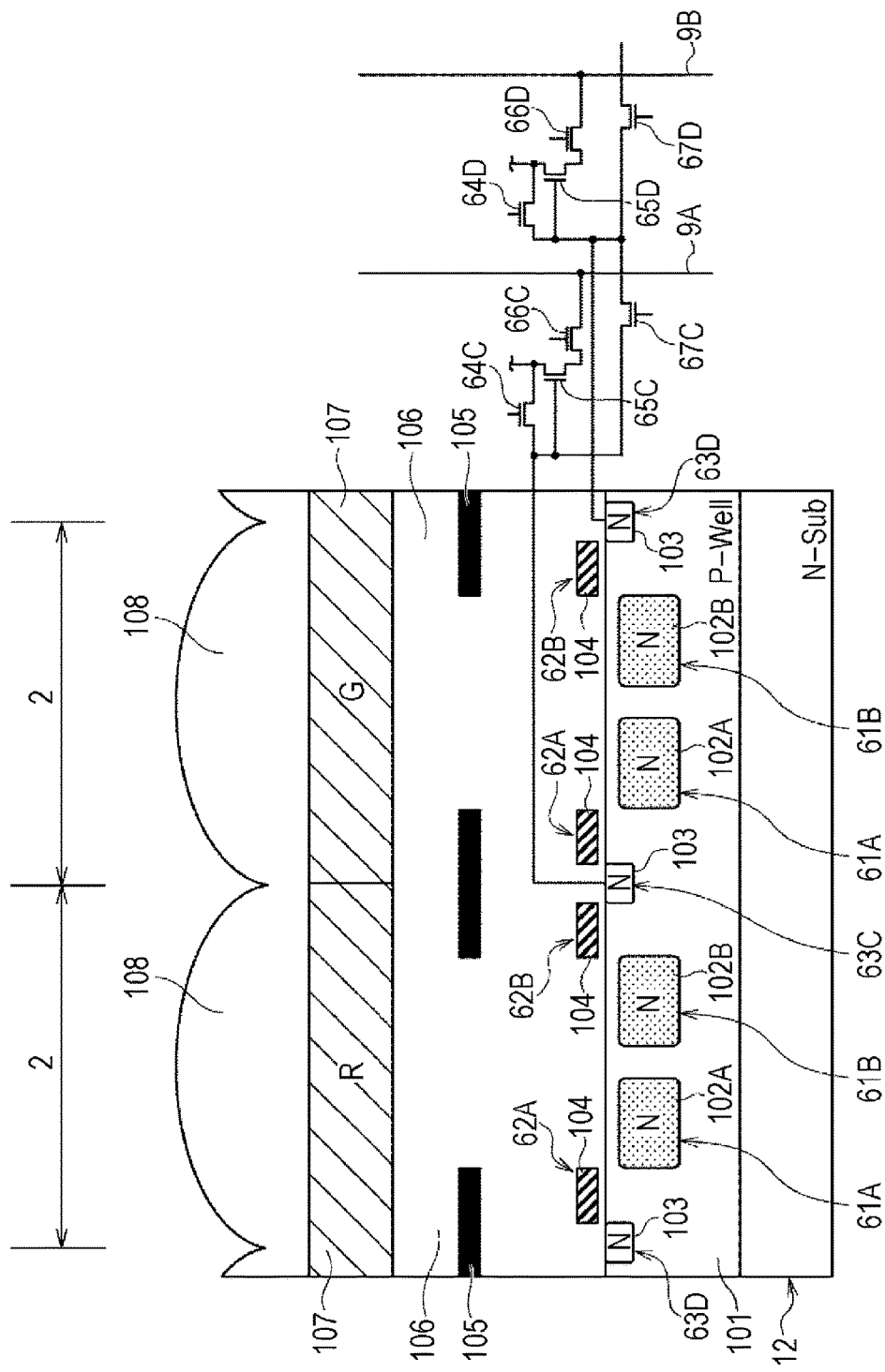
FIG. 5 is a diagram illustrating a cross-sectional configuration of a pixel in a solid-state imaging device of a front side illumination type.

As illustrated in FIG. 5 described later, the two photodiodes 61A and 61B included inside one pixel are formed such that a light receiving area is divided into two portions, for example, in the vertical direction or in the lateral direction. In the case where the pixel 2 is used as the focus detecting pixel, a deviation may be caused on an image generated from the two photodiodes 61A and 61B because the two photodiodes 61A and 61B are formed in different positions inside one pixel. A phase deviation amount is calculated from the above deviation on the image, and a defocus amount is calculated. Then, an imaging capturing lens is adjusted (moved), thereby achieving automatic focus.

<Driving Pixel 2>

Figure 4:
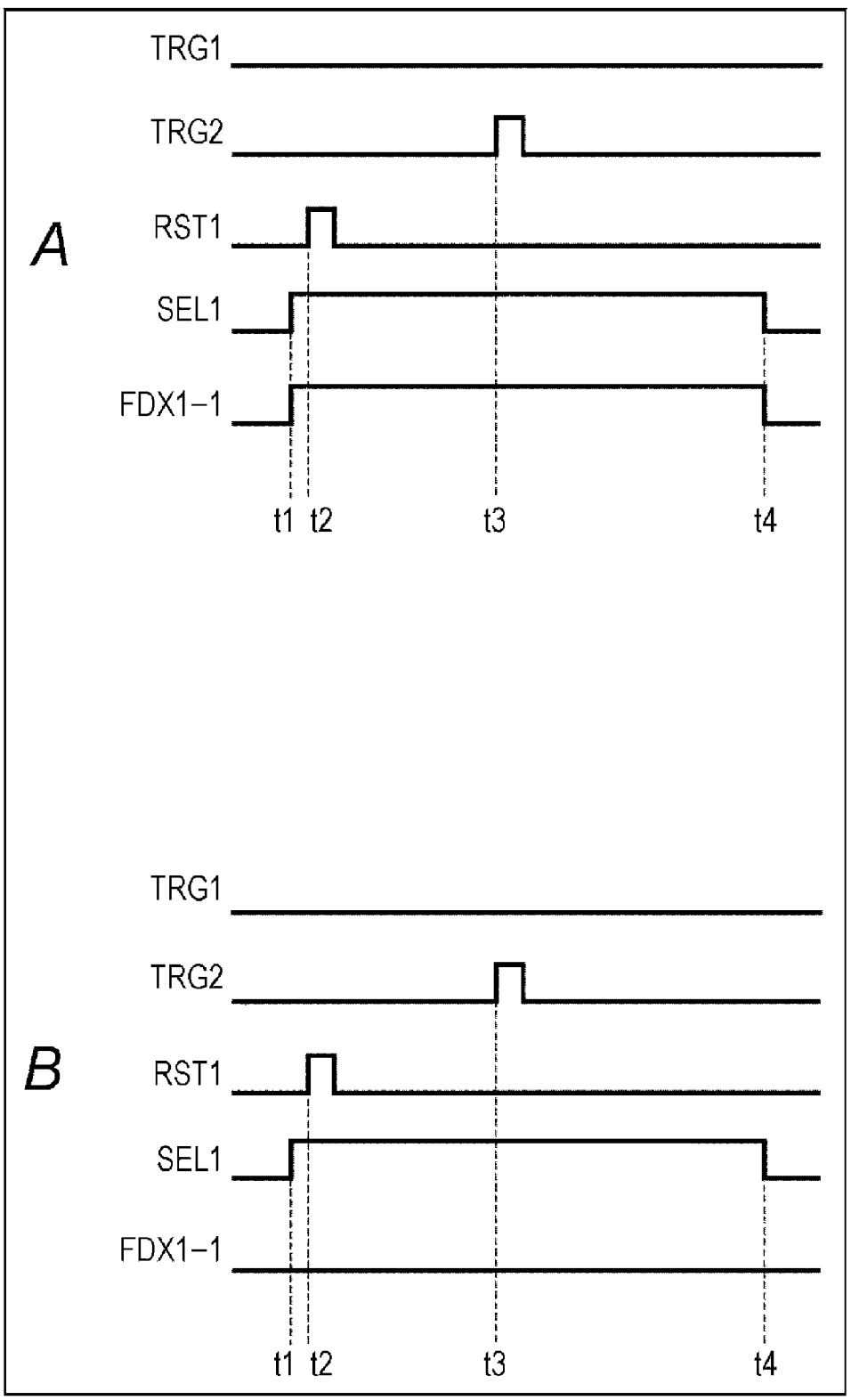
FIGS. 4A and 4B are timing charts illustrating examples of pixel driving.

FIGS. 4A and 4B are timing charts illustrating examples of driving the pixel $2_{12}$ out of the four pixels $2_{11}$ to $2_{14}$ illustrated in FIG. 3.

FIG. 4A is the case where the pixel $2_{12}$ is used as the image generating pixel, and FIG. 4B is the case where the pixel $2_{12}$ is used as the focus detecting pixel. Note that the cases of other pixels 2 other than the pixel $2_{12}$ are the same.

During a period from time t1 to time t4 in which the pixel $2_{12}$ is selected, the select signal SEL1 of the pixel $2_{12}$ is set Hi, and the two selecting transistors 66C and 66D of the pixel $2_{12}$ are turned on.

Further, during the period in which the pixel $2_{12}$ is selected, the reset signal RST1 of the pixel $2_{12}$ is initially set Hi for a predetermined period from time t2, and the two reset transistors 64C and 64D of the pixel $2_{12}$ are turned on. By this, electrical potential of the two FD units 63C and 63D of the pixel $2_{12}$ is reset.

After that, the transfer signal TRG2 of the pixel $2_{12}$ is set Hi for a predetermined period from time t3, and the two transfer transistors 62A and 62B of the pixel $2_{12}$ are turned on. By this, the electric charges accumulated in the two photodiodes 61A and 61B of the pixel $2_{12}$ are transferred to the corresponding FD units 63C and 63D respectively. During the transfer period, the two selecting transistors 66C and 66D of the pixel $2_{12}$ are turned on. Therefore, the electric charges transferred to the FD units 63C and 63D are converted to voltage signals and output to the vertical signal line 9A and vertical signal line 9B from the amplification transistors 65C and 65D via the selecting transistors 66C and 66D.

The above operation is the same in the both of the cases where the pixel $2_{12}$ is used as the image generating pixel and used as the focus detecting pixel.

The FD connection signal FDX1-1 is different between the cases where the pixel $2_{12}$ is used as the image generating pixel and used as the focus detecting pixel. The FD connection signal FDX1-1 is supplied to the FD connecting transistor 67C located between the two FD units 63C and 63D where the electric charges generated at the two photodiodes 61A and 61B disposed inside the pixel $2_{12}$.

More specifically, in the case where the pixel $2_{12}$ is used as the image generating pixel, the FD connecting transistor 67C located between the two FD units 63C and 63D connected to the two photodiodes 61A and 61B inside the pixel $2_{12}$ is turned on during the period in which the pixel $2_{12}$ is selected, as illustrated in FIG. 4A.

On the other hand, in the case where the pixel $2_{12}$ is used as the focus detecting pixel, the FD connecting transistor 67C located between the two FD units 63C and 63D connected to the two photodiodes 61A and 61B inside the pixel $2_{12}$ is turned off during the period in which the pixel $2_{12}$ is selected, as illustrated in FIG. 4B.

The pixel signal obtained at the photodiode 61A inside the pixel $2_{12}$ and the pixel signal obtained at the photodiode 61B inside the pixel $2_{12}$ are simultaneously output from the vertical signal line 9A and vertical signal line 9B.

In the case where the pixel $2_{12}$ is used as the image generating pixel, the pixel signal obtained at the photodiode 61A and the pixel signal obtained at the photodiode 61B inside the pixel $2_{12}$ are processed as the same pixel signal because the pixel signals are combined by the FD connecting transistor 67C.

On the other hand, in the case where the pixel $2_{12}$ is used as the focus detecting pixel, the pixel signal obtained at the photodiode 61A and the pixel signal obtained at the photodiode 61B within the pixel $2_{12}$ are processed as separate pixel signals (phase difference signals) because the pixel signals are separated by the FD connecting transistor 67C.

According to the first pixel circuit configuration of the present disclosure, in the case where the pixel 2 is used as the focus detecting pixel, the respective pixel signals at the divided two photodiodes 61A and 61B can be output simultaneously. Further, in the case where the pixel 2 is used as the image generating pixel, an image signal obtained by connecting the divided two photodiodes 61A and 61B can be output.

Therefore, since the pixel 2 can be used for both purposes of focus detection and image generation, the focus detecting pixel 2 does not become a defective pixel when an image is generated, different from the type of focus detecting pixel in which the pixel is partly shielded from the light.

In the case of using the pixel 2 as the image generating pixel, the two reading circuits are connected and used simultaneously. This enlarges an effective transistor size, thereby achieving to reduce noise of a source follower amplifier. Additionally, circuit noise can be reduced by using the separate column signal processing circuits 5 (A/D conversion units) via the two of vertical signal line 9A and vertical signal line 9B.

Further, the capacity of the FD unit 63 is optimally set for the electric charge amount obtainable by one photodiode 61. Therefore, in the both cases where the pixel 2 is used as the focus detecting pixel and as the image generating pixel, the capacity of the FD unit 63 is optimal. In other words, according to the first pixel circuit configuration of the present disclosure, both securing the dynamic range of the pixel signal and improving the S/N ratio can be achieved.

Meanwhile, in the case of using the pixel 2 as the focus detecting pixel, control can be executed such that only one of the photodiodes 61 inside one pixel receives the light for the purpose of power consumption saving, in the same manner as the focus detecting pixel in which the pixel is partly shielded from the light. In this case, an unused FD unit 63 inside the same pixel is connected by turning on the FD connecting transistor 67C, and the capacity can be varied. Additionally, in a connecting method of FIG. 3 and FIG. 7 described later, in the case of varying the capacity, it is necessary that the transfer control lines 81 of the transfer transistors 62A and 62B are separately provided, and the transfer signals TRG respectively supplied thereto are divided into, for example, TRG1A, TRG1B, TRG2A, TRG2B, and so on.

<Cross-Sectional Configuration Diagram of Pixel>

FIG. 5 is a diagram illustrating a cross-sectional configuration of the pixel 2 in the solid-state imaging device 1.

In the solid-state imaging device 1, as illustrated in FIG. 5, for example, two n-type semiconductor regions 102A and 102B are formed in each pixel 2 relative to a p-type semiconductor region (P-Well) 101 formed on the n-type semiconductor substrate 12. The two n-type semiconductor regions 102A and 102B respectively constitute the photodiodes 61A and 61B by p-n junction with the p-type semiconductor region 101.

An n-type semiconductor region 103 constituting the FD unit 63C or 63D is formed at a pixel boundary on an upper-side interfacial surface of the p-type semiconductor region 101.

Further, a gate electrode 104 of the transfer transistor 62A is formed of, for example, polysilicon on an upper surface of the semiconductor substrate 12 between the n-type semiconductor region 102A and the n-type semiconductor region 103. In the same manner, the gate electrode 104 of the transfer transistor 62B is formed of, for example, polysilicon on the upper surface of the semiconductor substrate 12 between the n-type semiconductor region 102B and the n-type semiconductor region 103.

Above the n-type semiconductor region 103 to become the FD unit 63C or 63D, an inter-pixel shielding film 105 configured to avoid leakage of incident light from other adjacent pixels is formed of a metal film such as tungsten (W), aluminum (Al), or copper (Cu).

For example, a color filter 107 of red (R), green (G), or blue (B) is formed using, for example, nitride film (SiN), oxynitride film (SiON), oxide film (SiO2), and the like on the upper side of an insulation layer 106 having a flat upper surface, and an on-chip lens 108 is formed on the upper side of the color filter 107. The red (R), green (G), or blue (B) of the color filter 107 is arranged in a Bayer array, for example, but may also be arranged in accordance with other arraying methods. The color filter 107 is formed by performing spin-coating with photosensitive resin including pigments such as colorant and a dye. The on-chip lens 108 is formed of resin material, such as a styrene resin, an acrylic resin, a styrene-acrylic copolymer resin, or a siloxane-based resin.

The reset transistors 64C and 64D, amplification transistors 65C and 65D, selecting transistors 66C and 66D, and FD connecting transistor 67C and 67D are formed in, for example, the inter-pixel area in the vertical direction, other than the cross-sectional portion illustrated in FIG. 5.

As described above, the solid-state imaging device 1 can be formed of the solid-state imaging device of a front side illumination type in which the light enters from a front surface side of the semiconductor substrate 12 on which a pixel transistor is formed.

Figure 6:
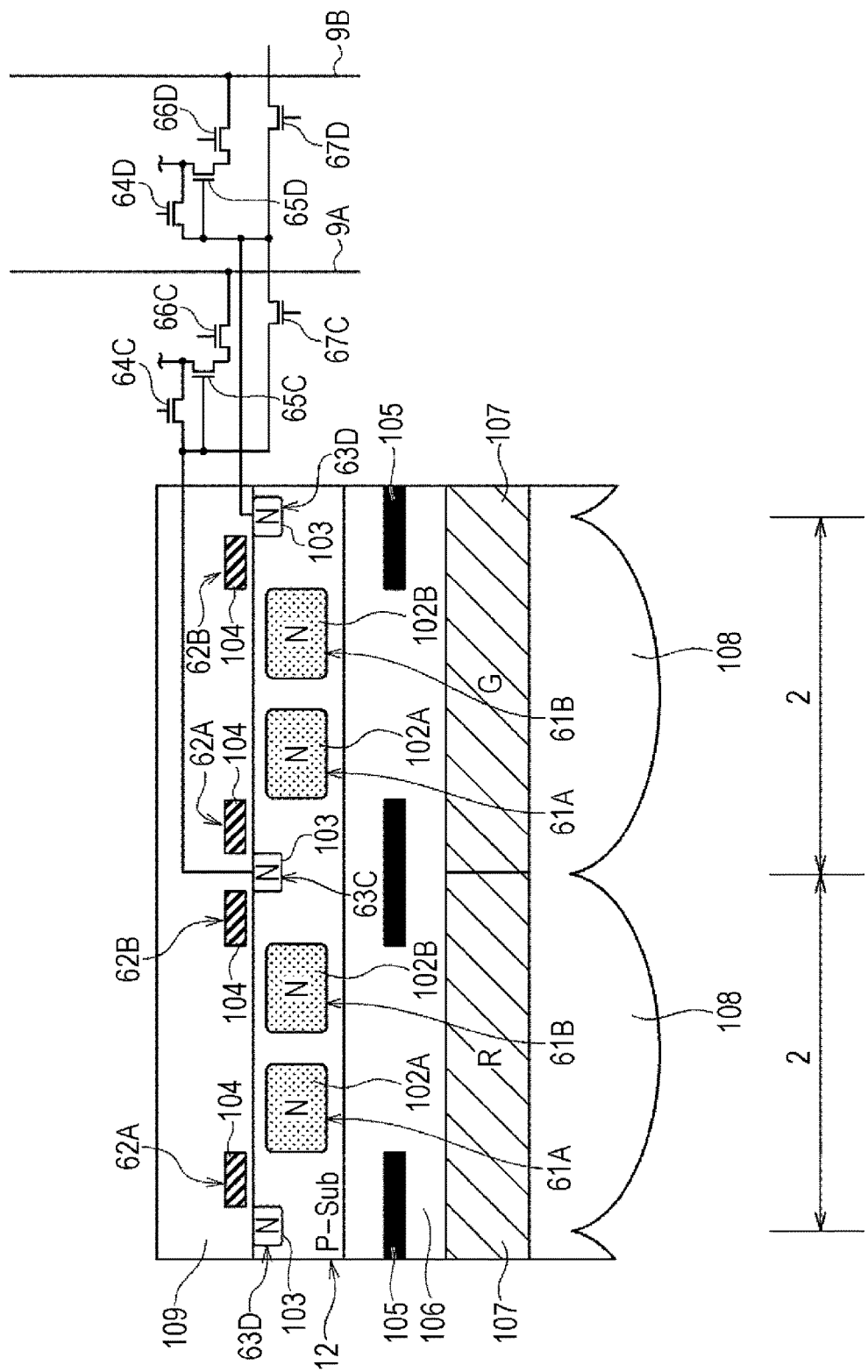
FIG. 6 is a diagram illustrating a cross-sectional configuration of a pixel in a solid-state imaging device of a backside illumination type.

Additionally, as illustrated in FIG. 6, the solid-state imaging device 1 may be formed of the solid-state imaging device of a backside illumination type in which the light enters from the back surface side opposite to the front surface side of the semiconductor substrate 12 on which the pixel transistor is formed.

In the cross-sectional configuration diagram of the solid-state imaging device 1 of the backside illumination type illustrated in FIG. 6, the semiconductor substrate 12 is a p-type substrate, and the n-type semiconductor regions 102A and 102B constituting the photodiodes 61A and 61B and the n-type semiconductor region 103 constituting the FD unit 63C or 63D are formed inside the p-type semiconductor substrate 12.

Further, the transfer transistors 62A and 62B are formed on the front surface side of the p-type semiconductor substrate 12 and covered with an insulation layer 109. On the other hand, the inter-pixel shielding film 105 and the insulation layer 106 are formed on the back surface side of the p-type semiconductor substrate 12, and the color filter 107 of red (R), green (G), or blue (B) and the on-chip lens 108 are formed on the upper side (on the lower side in FIG. 6) thereof.

<3. Pixel Circuit Configuration According to Second Embodiment>

Figure 7:
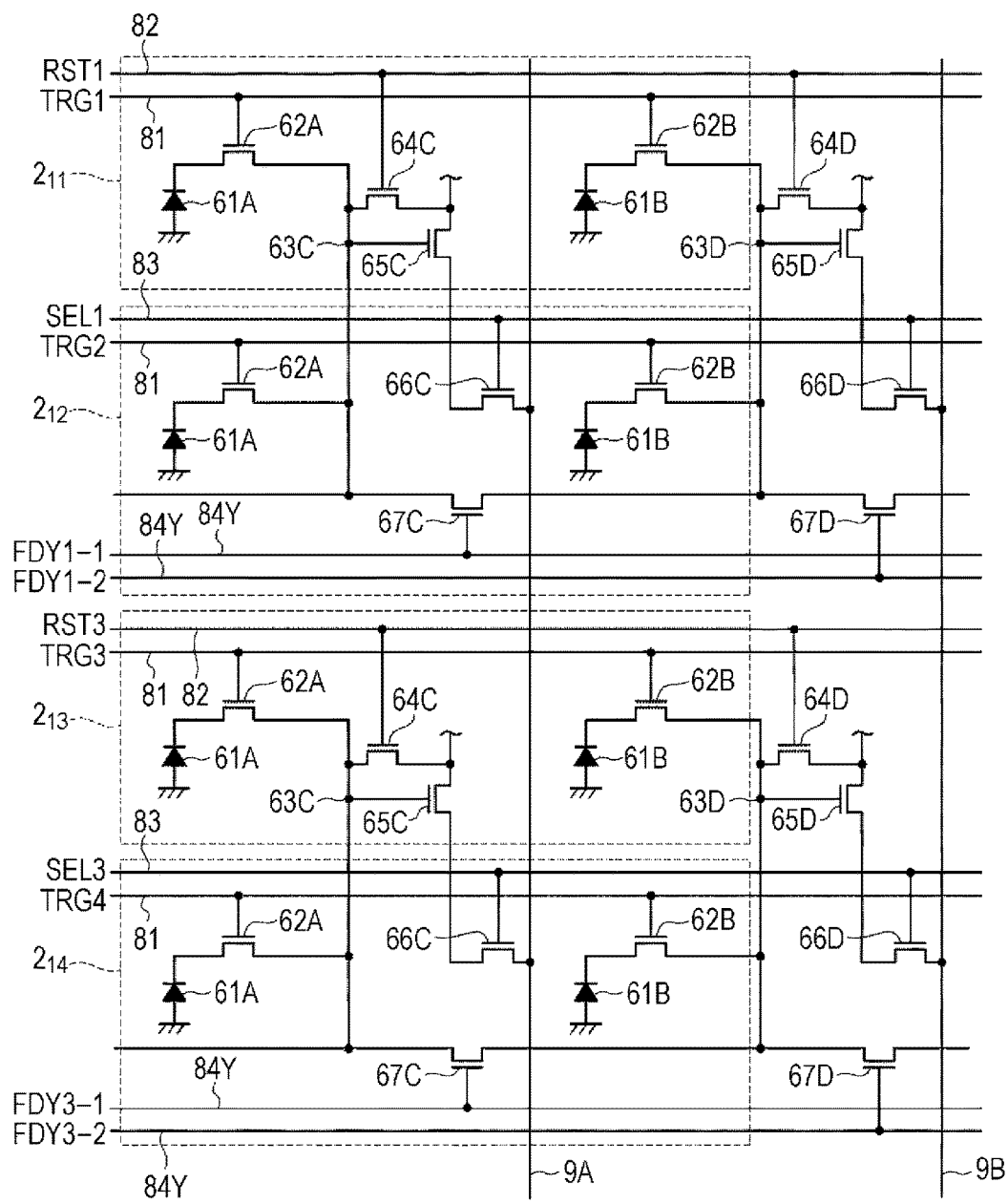
FIG. 7 is a diagram illustrating a circuit configuration of a second pixel in the pixel array unit of the solid-state imaging device.

FIG. 7 is a diagram illustrating a second pixel circuit configuration in a pixel array unit 3 of a solid-state imaging device 1.

In FIG. 7, components corresponding to those of a first pixel circuit configuration illustrated in FIG. 3 are denoted by same reference signs. Therefore, only points different from the first pixel circuit configuration will be described in a description for the second pixel circuit. The same is also applied to other pixel circuit configurations in the following.

According to the first pixel circuit configuration illustrated in FIG. 3, an FD connection control line 84X configured to supply an FD connection signal FDX to an FD connecting transistor 67 is arranged along a column direction (vertical direction). In contrast, according to the second pixel circuit configuration in FIG. 7, an FD connection control line 84Y configured to supply an FD connection signal FDY to the FD connecting transistor 67 is arranged along a row direction (horizontal direction).

In the case of using a pixel 2 as a focus detecting pixel, it is difficult to simultaneously turn on FD connecting transistors 67C and 67D laterally adjacent. Therefore, according to the second pixel circuit configuration, two of the FD connection control lines 84Y are disposed and alternately connected to the adjacent FD connecting transistors 67 in order that the FD connecting transistors 67 laterally adjacent can be controlled differently.

<4. Pixel Circuit Configuration According to Third Embodiment>

Figure 8:
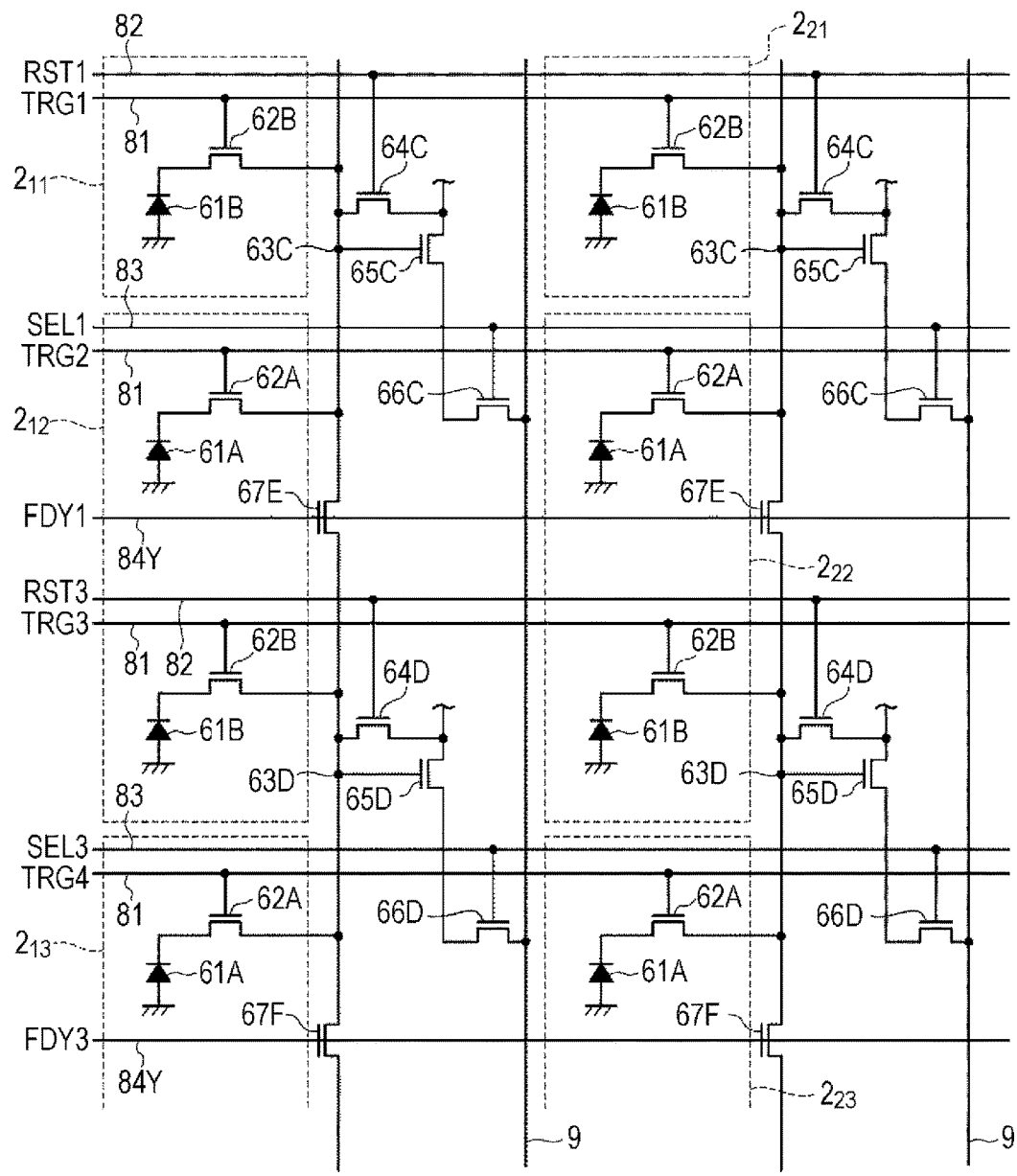
FIG. 8 is a diagram illustrating a circuit configuration of a third pixel in the pixel array unit of the solid-state imaging device.

FIG. 8 is a diagram illustrating a third pixel circuit configuration in a pixel array unit 3 of a solid-state imaging device 1.

According to first and second pixel circuits described above, an FD connecting transistor 67 is disposed so as to mutually connect respective FD units 63 laterally arrayed. In contrast, according to the third pixel circuit, the FD connecting transistor 67 is disposed so as to mutually connect the respective FD units 63 vertically arrayed as illustrated in FIG. 8. Further, photodiodes 61A and 61B aligned in a vertical direction are included in one pixel 2.

For example, an FD unit 63C holding an electric charge generated at one photodiode 61A of a pixel $2_{12}$ and an FD unit 63D holding an electric charge generated at the other photodiode 61B of the pixel $2_{12}$ are connected via an FD connecting transistor 67E. An FD connection signal FDY1 is supplied to the FD connecting transistor 67E of the pixel $2_{12}$ via an FD connection control line 84Y arranged along the row direction.

Further, for example, an FD unit 63D where an electric charge generated at one photodiode 61A of a pixel $2_{13}$ and an FD unit 63C (not illustrated) where an electric charge generated at the other photodiode 61B (not illustrated) of the pixel $2_{13}$ are connected via an FD connecting transistor 67F of the pixel $2_{13}$. An FD connection signal FDY3 is supplied to the FD connecting transistor 67F of the pixel $2_{13}$ via the FD connection control line 84Y.

Figure 9:
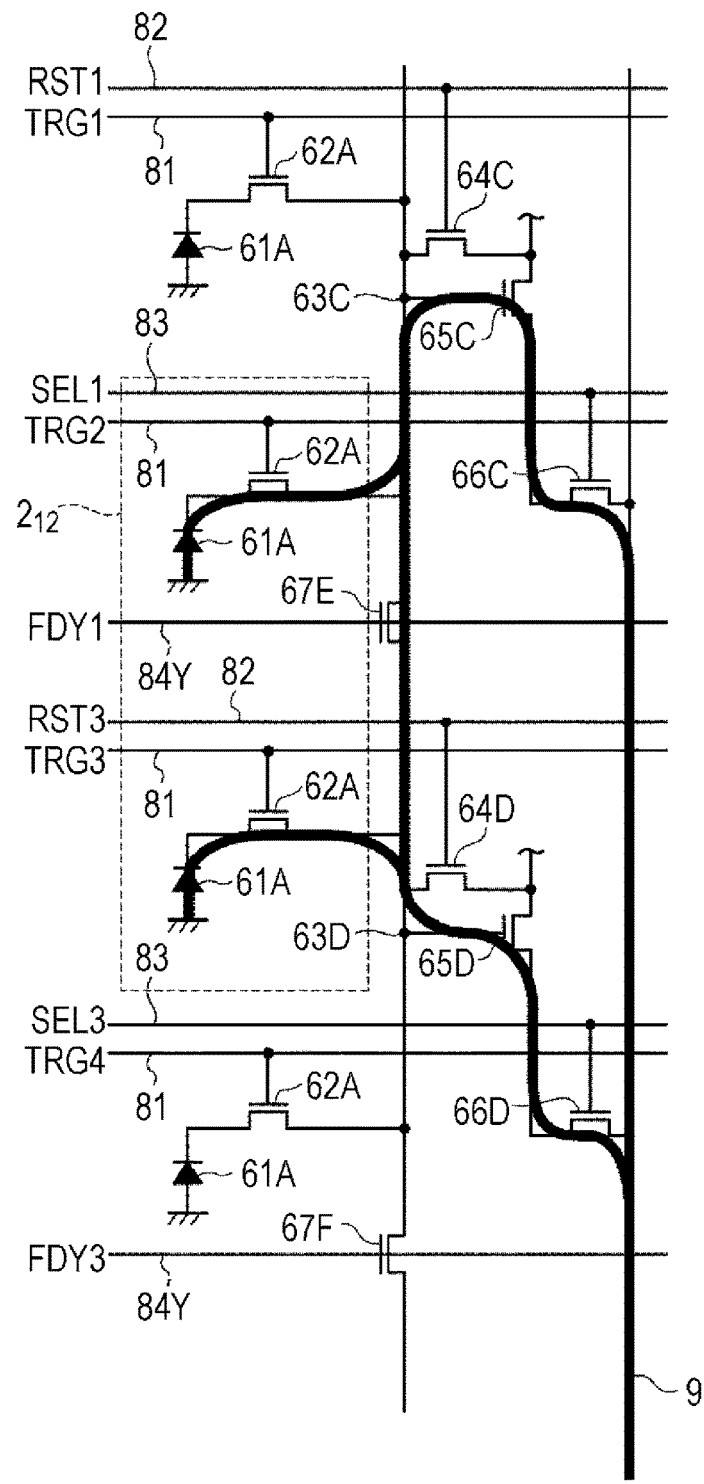
FIG. 9 is an explanatory diagram for describing pixel operation in the third pixel circuit configuration.

According to the above-described third pixel circuit configuration, in the case where the pixel $2_{12}$ is used as an image generating pixel, for example, the FD connecting transistor 67E is turned on and the electric charge generated at the photodiode 61A and the electric charge generated at the photodiode 61B of the pixel $2_{12}$ are simultaneously read as illustrated in FIG. 9.

Meanwhile, according to an example in FIG. 9, the electric charge generated at the photodiode 61A and the electric charge generated at the photodiode 61B of the pixel $2_{12}$ are read by using both an amplification transistor 65C and an amplification transistor 65D, but can also be read only from one of the amplification transistor 65C and amplification transistor 65D.

Figure 10:
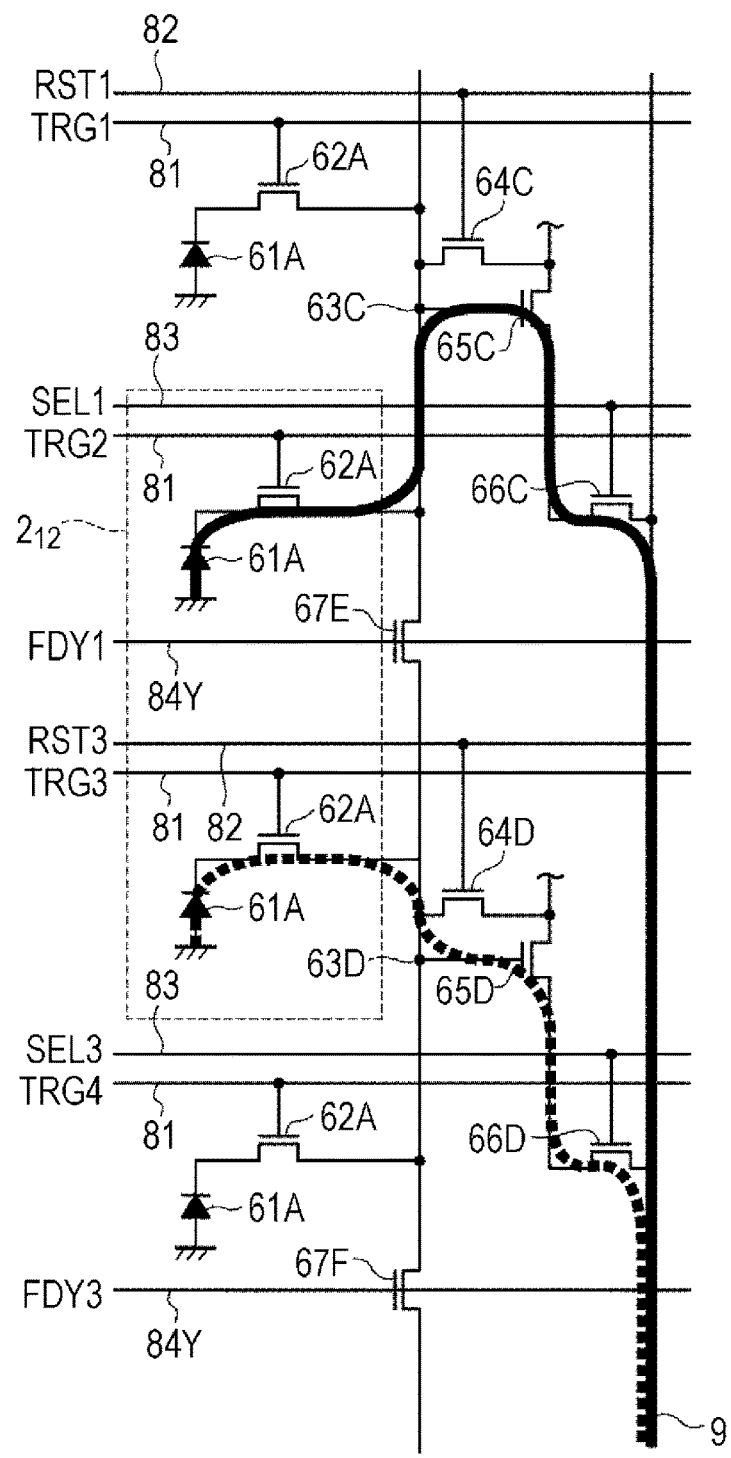
FIG. 10 is an explanatory diagram for describing the pixel operation in the third pixel circuit configuration.

In contrast, in the case where the pixel $2_{12}$ is used as a focus detecting pixel, the electric charge generated at the photodiode 61A of the pixel $2_{12}$ is output to a vertical signal line 9, passing through the FD unit 63C, the amplification transistor 65C, and a selecting transistor 66C as indicated by a thick solid line in FIG. 10.

Further, the electric charge generated at the photodiode 61B of the pixel $2_{12}$ is output to the vertical signal line 9, passing through the FD unit 63D, the amplification transistor 65D and a selecting transistor 66D as indicated by a thick dotted line in FIG. 10.

Therefore, since both electric charges are output to the same vertical signal line 9, it is necessary that reading a signal electric charge of the photodiode 61A and reading a signal electric charge of the photodiode 61B is performed in separate periods.

<5. Pixel Circuit Configuration According to Fourth Embodiment>

Figure 11:
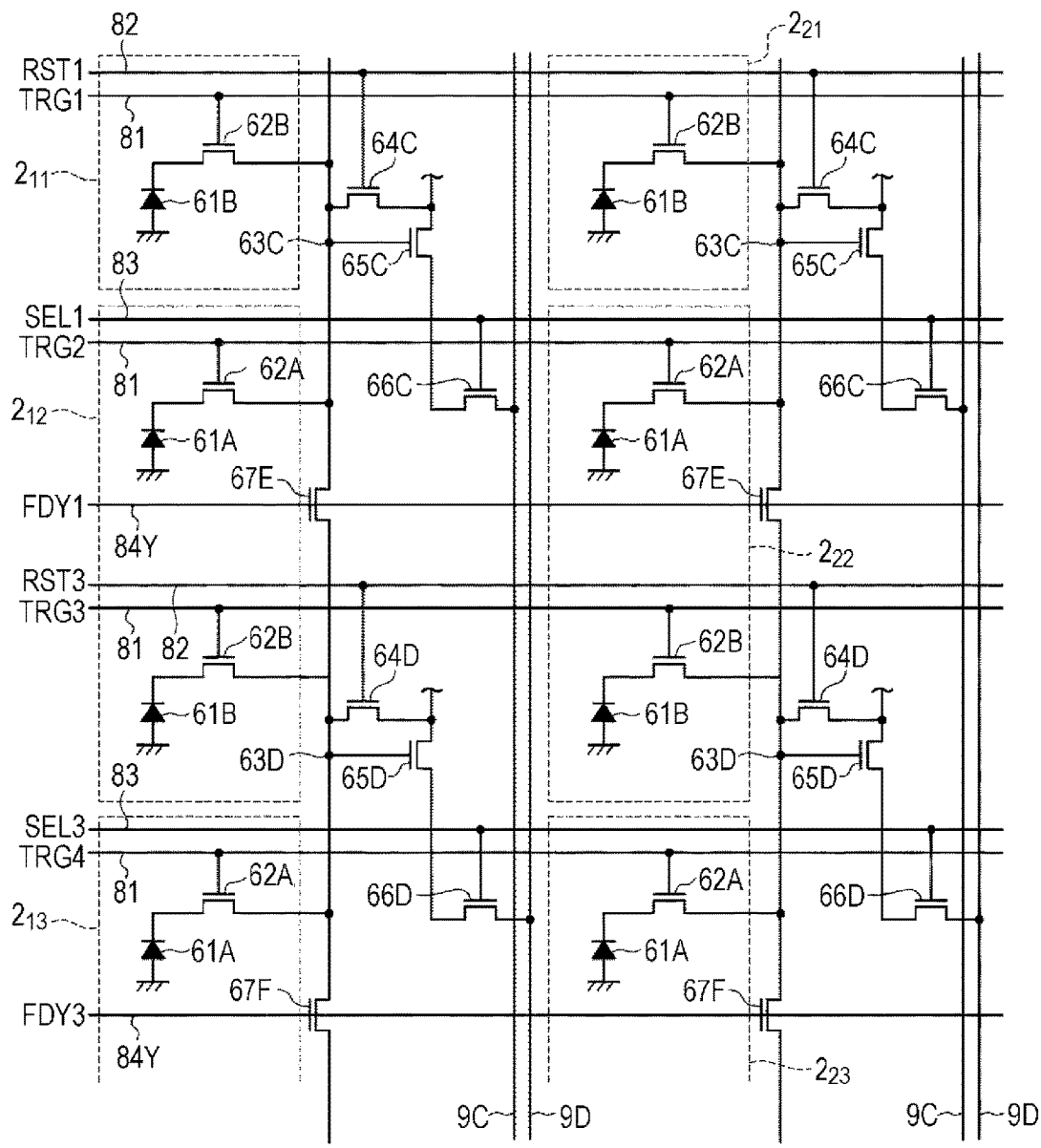
FIG. 11 is a diagram illustrating a fourth pixel circuit configuration in the pixel array unit of the solid-state imaging device.

Now, FIG. 11 is a diagram illustrating a pixel circuit configuration in which reading a signal electric charge of a photodiode 61A and reading a signal electric charge of a photodiode 61B are made to be performed simultaneously in the case where an FD connecting transistor 67 is disposed so as to mutually connect respective FD units 63 vertically arrayed.

In other words, FIG. 11 is the diagram illustrating a fourth pixel circuit configuration in a pixel array unit 3 of a solid-state imaging device 1.

According to the fourth pixel circuit configuration, two vertical signal lines 9C and 9D are disposed per pixel column. An amplification transistor 65C is connected to the vertical signal line 9C via a selecting transistor 66C, and an amplification transistor 65D is connected to the vertical signal line 9D via a selecting transistor 66D.

Figure 12:
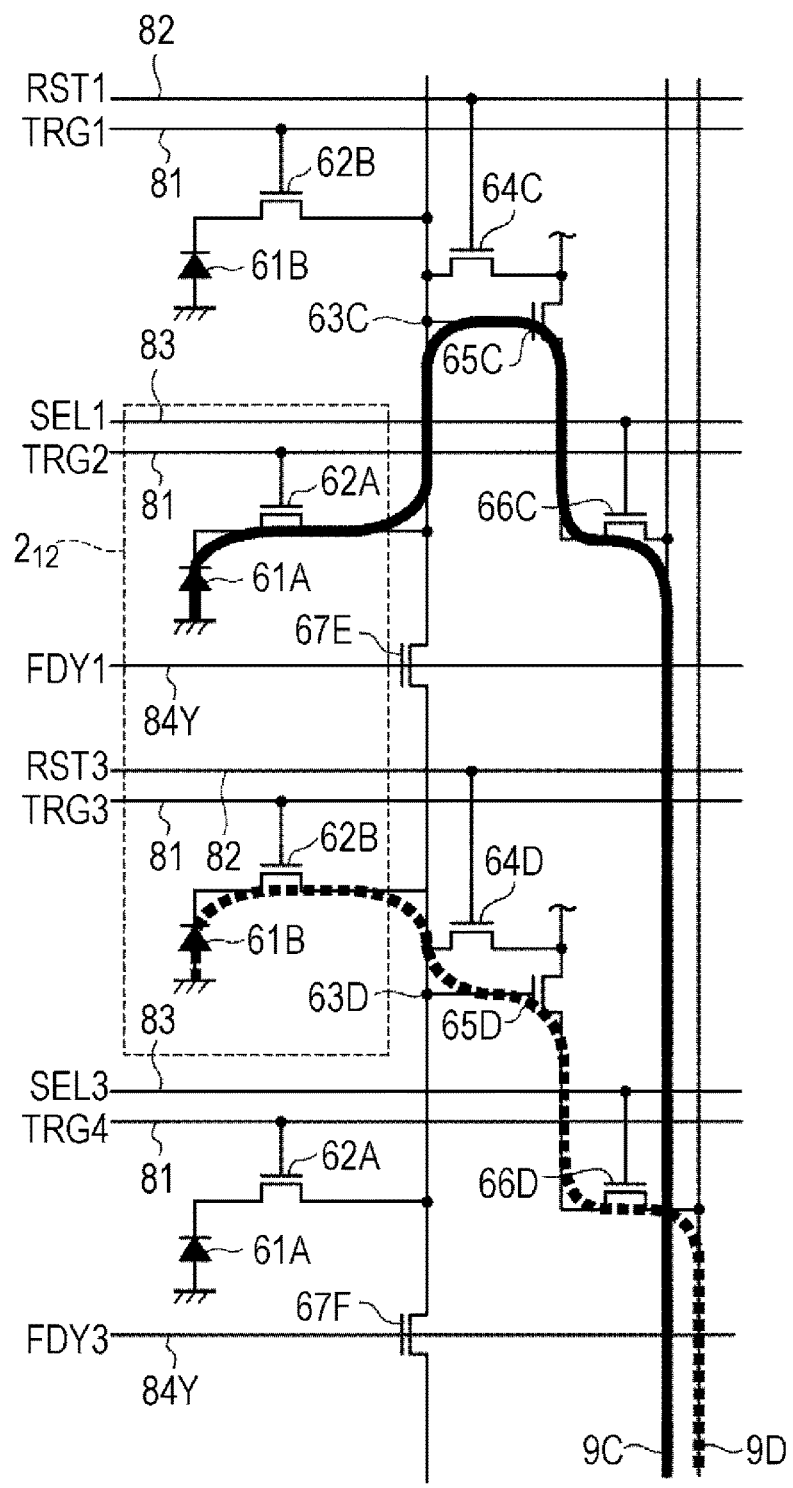
FIG. 12 is an explanatory diagram for describing the pixel operation in the fourth pixel circuit configuration.

Therefore, according to the fourth pixel circuit configuration, even in the case where a pixel $2_{12}$ is used as a focus detecting pixel, a signal electric charge of the photodiode 61A and a signal electric charge of the photodiode 61B can be read simultaneously as illustrated in FIG. 12, and therefore high-speed reading can be achieved.

Figure 13:
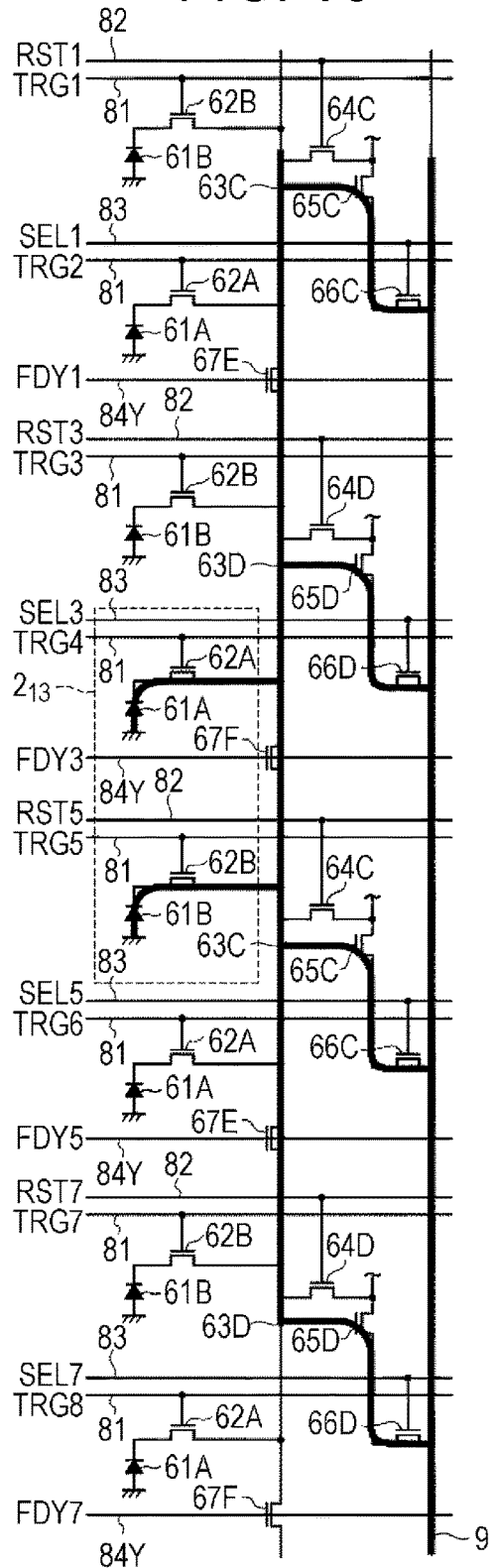
FIG. 13 is an explanatory diagram for describing the pixel operation in the fourth pixel circuit configuration.

In the case where the FD connecting transistor 67 is disposed so as to mutually connect the respective FD units 63 vertically arrayed like the third and fourth pixel circuit configurations, capacity of the FD unit 63 per pixel can be varied Q times (Q=1, 2, 3, . . . ) by simultaneously connecting a plurality of consecutive FD units 63 as illustrated in FIG. 13. Varying the FD capacity can be utilized in both cases of using a pixel 2 as the focus detecting pixel and as an image generating pixel.

Figure 14:
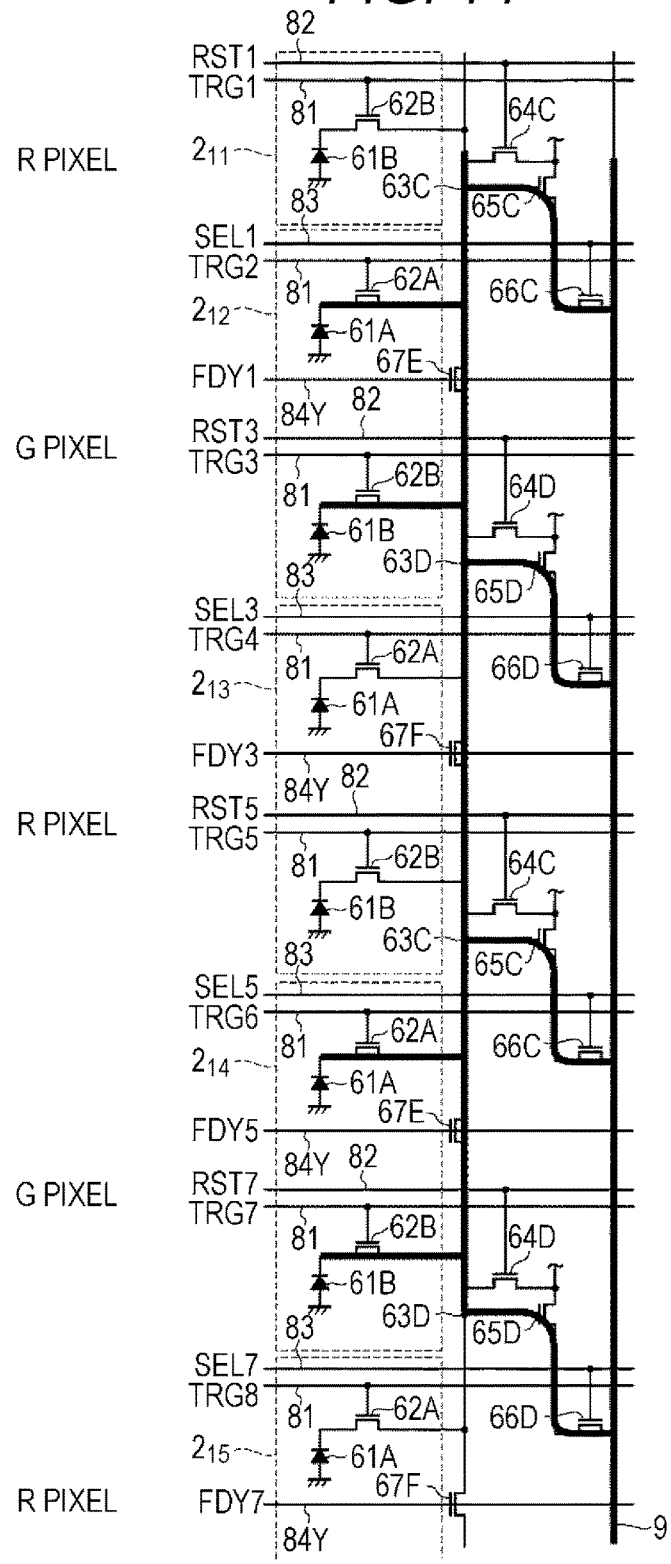
FIG. 14 is a diagram for describing FD adding operation.

Further, as illustrated in FIG. 14, pixel signals of a plurality of same color pixels adjacent in a vertical direction can be added at the FD units 63 and then output by simultaneously turning on transfer transistors 62 of the plurality of same color pixels adjacent in the vertical direction and simultaneously connecting the plurality of consecutive FD units 63.

<6. Pixel Circuit Configuration According to Fifth Embodiment>

Figure 15:
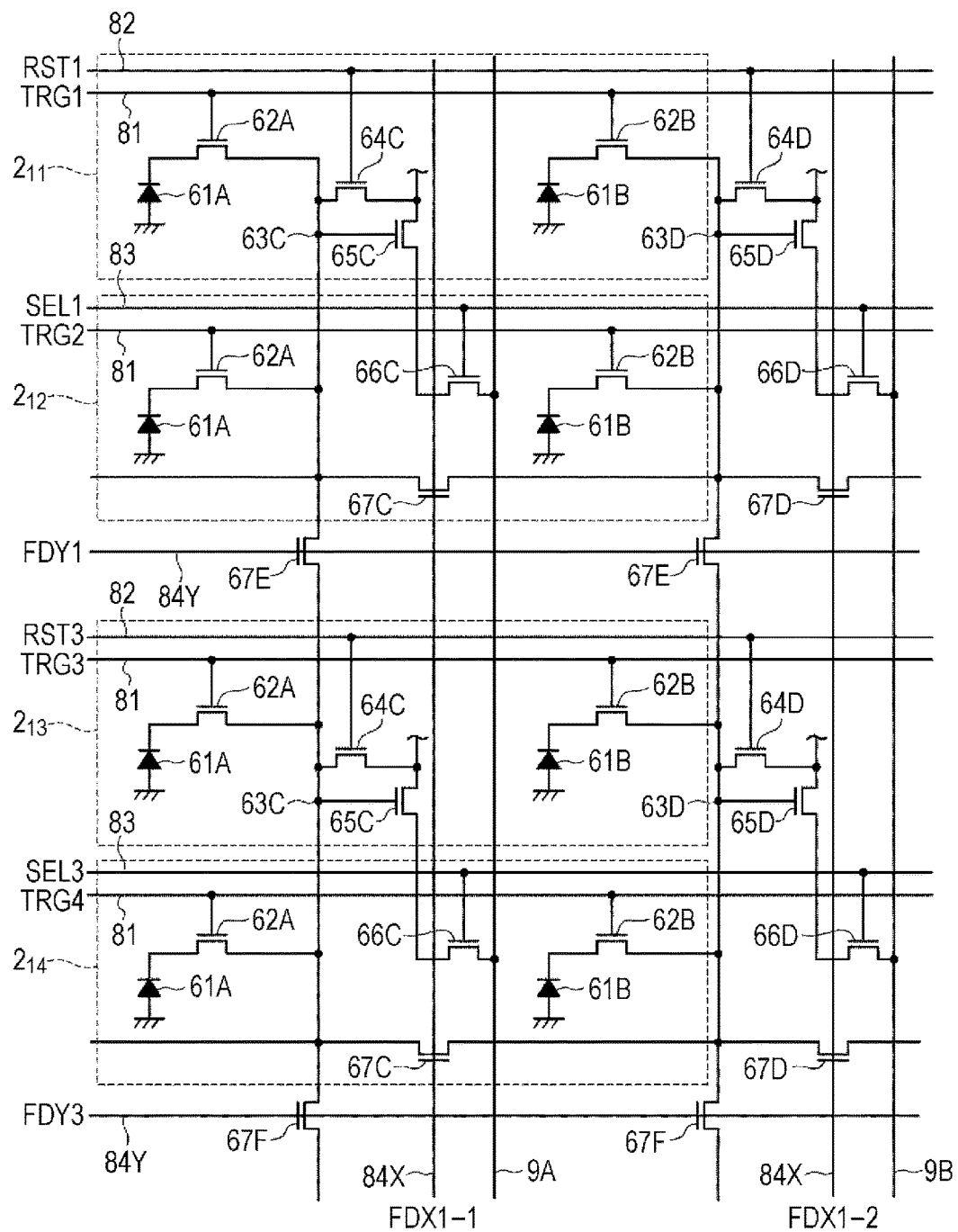
FIG. 15 is a diagram illustrating a fifth pixel circuit configuration in the pixel array unit of the solid-state imaging device.

FIG. 15 is a diagram illustrating a fifth pixel circuit configuration in a pixel array unit 3 of a solid-state imaging device 1.

The fifth pixel circuit configuration has a configuration in which FD connecting transistors 67E and 67F are further added to a first pixel circuit configuration illustrated in FIG. 3 such that respective FD units 63 can be further connected in the vertical direction.

For example, an FD unit 63C holding an electric charge generated at a photodiode 61A of a pixel $2_{12}$ and an FD unit 63C holding an electric charge generated at the photodiode 61A of a pixel $2_{13}$ are connected via the FD connecting transistor 67E.

In the same manner, an FD unit 63D holding an electric charge generated at a photodiode 61B of a pixel $2_{12}$ and an FD unit 63D holding an electric charge generated at the photodiode 61B of a pixel 213 are connected via the FD connecting transistor 67E. An FD connection signal FDY1 is supplied to each of FD connecting transistors 67E between the pixel $2_{12}$ and the pixel $2_{13}$ via an FD connection control line 84Y.

The FD unit 63C holding an electric charge generated at a photodiode 61A and the FD unit 63D holding an electric charge generated at a photodiode 61B of a pixel $2_{14}$ are also connected respectively to the FD unit 63C holding an electric charge generated at a photodiode 61A and the FD unit 63D holding an electric charge generated at a photodiode 61B of a pixel $2_{15}$ not illustrated via the FD connecting transistors 67F. An FD connection signal FDY3 is supplied to each of the FD connecting transistors 67F between the pixel $2_{14}$ and the pixel $2_{15}$ via the FD connection control line 84Y.

According to the fifth pixel circuit configuration illustrated in FIG. 15, an FD connecting transistor 67C turns on/off connection between two FD units 63C and 63D that hold accumulated electric charges of the two photodiodes 61A and 61B inside one pixel. Therefore, the FD connecting transistor 67C is turned on/off depending on whether a pixel 2 is used as an image generating pixel or used as a focus detecting pixel.

On the other hand, an FD connecting transistor 67D is turns on/off connection between the FD units 63 which hold accumulated electric charges of the pixels 2 adjacent in a row direction. Therefore, the FD connecting transistor 67D is turned on in the case of executing FD adding for pixel signals of a plurality of pixels 2 adjacent in the row direction or in the case of varying FD capacity.

Further, the FD connecting transistors 67E and 67F turn on/off connection between the FD units 63 which hold accumulated electric charges of the pixels 2 adjacent in a column direction. Therefore, the FD connecting transistors 67E and 67F are turned on in the case of executing FD adding for the pixel signals of the plurality of pixels 2 adjacent in the column direction or in the case of varying the FD capacity.

<7. Pixel Circuit Configuration According to Sixth Embodiment>

In first to fifth embodiments described above, a description has been given for examples in which a reading circuit formed of an FD unit 63, a reset transistor 64, an amplification transistor 65, and a selecting transistor 66 is shared by adjacent two pixels.

However, a technology related to the present disclosure can also have a configuration in which the reading circuit can be shared by three or more adjacent pixels.

Figure 16:
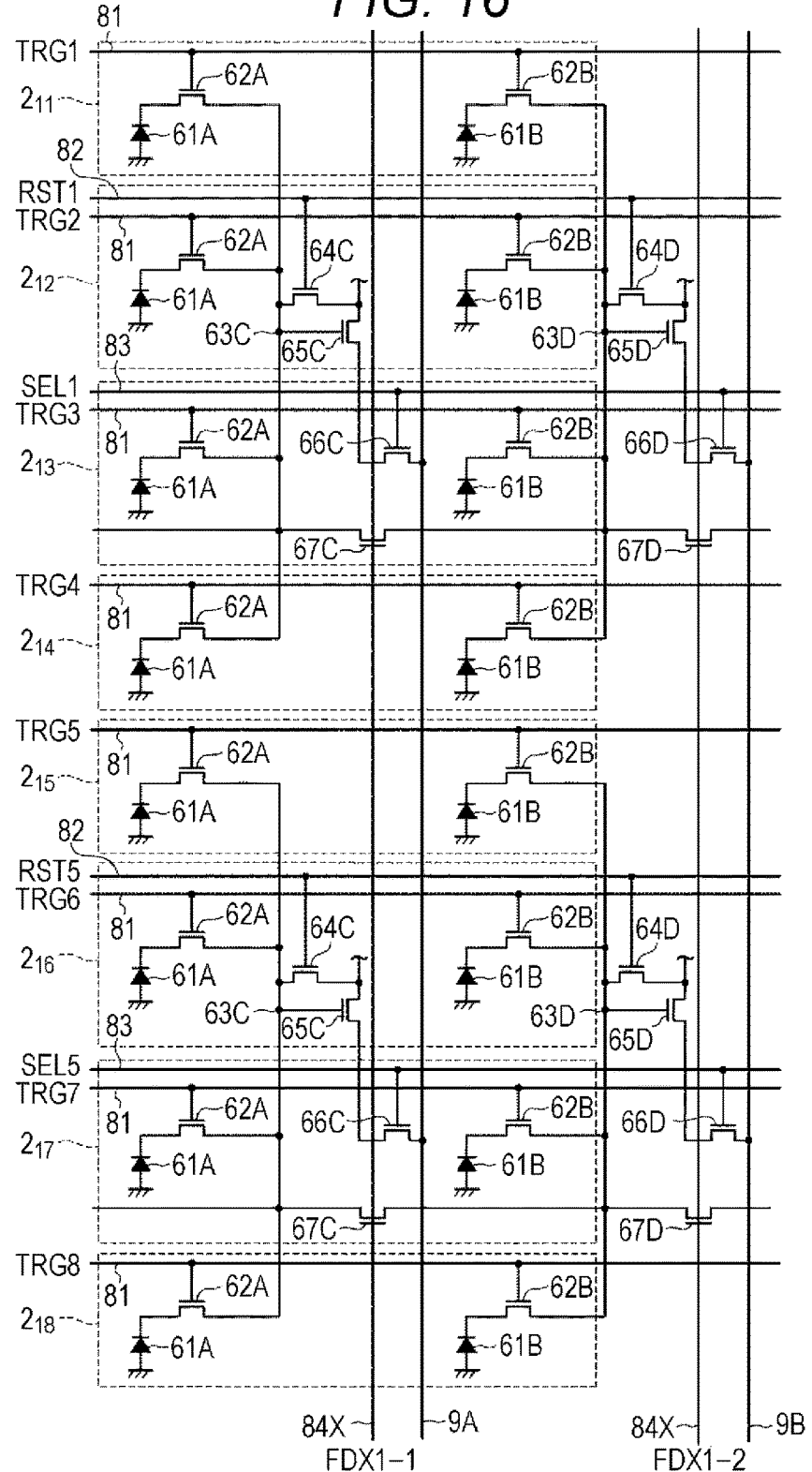
FIG. 16 is a diagram illustrating a sixth pixel circuit configuration in the pixel array unit of the solid-state imaging device.

FIG. 16 is a diagram illustrating a sixth pixel circuit configuration in a pixel array unit 3 of a solid-state imaging device 1.

According to the sixth pixel circuit configuration in FIG. 16, one reading circuit is shared by four pixels adjacent in a vertical direction. Other components are same as those in a first embodiment described above.

According to the first to sixth pixel circuit configurations related to the present disclosure described above, a defective pixel is hardly generated in both of the cases of using a pixel 2 for focus detection and image generation because two photodiodes 61 are provided inside one pixel and electric charges respectively generated can be read by different reading circuits.

In the case of using the pixel 2 as a focus detecting pixel, pixel signals of divided two photodiodes 61A and 61B can be used as phase difference signals. Therefore, a circuit size increase can be minimized and also the focus detecting pixels can be arranged in high density.

Further, since the FD unit 63 disposed corresponding to the photodiode 61 can be connected to the FD units 63 adjacent in the vertical direction, in the lateral direction or in both directions, capacity of the FD unit 63 can be varied.

Meanwhile, according to the above-described examples, it has been described that the capacity of the FD unit 63 is set optimal for an electric charge amount obtainable by one photodiode 61. However, in the case of preconditioning that electric charges are held at a plurality of FD units 63 connected by the FD connecting transistor 67 with respect to one photodiode 61, the capacity of one FD unit 63 can be set smaller than the electric charge amount obtainable by one photodiode 61. More specifically, a ratio between the electric charge amount obtainable by one photodiode 61 and the electric charge amount that can be held by one FD unit 63 may be set to photodiode 61:FD unit 63=1:1, or photodiode 61:FD unit 63=Q:1 (Q=any of 2, 3, 4, . . . ).

According to the first to sixth pixel circuit configurations related to the present disclosure, freedom degree of the capacity of the FD unit 63 can be increased because of the configuration in which the FD unit 63 provided corresponding to the photodiode 61 can be connected to adjacent other FD units 63. For example, when a received light amount is small, the present technology can be used by using connection to reduce the capacity of the FD unit 63 to increase conversion efficiency, and when the received light amount is large, the present technology can be used by connecting the plurality of FD units 63 to increase the capacity and enlarge a dynamic range.

Further, a ratio of the electric charge amount between the two photodiodes 61A and 61B disposed inside one pixel 2 may be set to photodiode 61A:photodiode 61B=Q:1 (Q is a positive real number larger than zero) instead of photodiode 61A:photodiode 61B=1:1 described above.

Moreover, in the case where a low resolution of a captured image can be accepted, such as at the time of photographing a moving image or photographing in a live view mode, reading may be executed by connecting the adjacent pixels 2 with the FD unit 63. As a result, an added signal can be obtained by executing FD adding on the pixel signals of the plurality of pixels. Normally, in the case of generating an image having a low resolution by executing pixel thinning, moire or the like may occur, but the moire or the like can be reduced by generating the added signal obtained by FD adding. Further, FD adding of the pixel signals is more advantageous in aspects of power consumption and processing speed, comparing with analog addition or digital addition other than addition at the FD.

Meanwhile, the circuit configuration of the pixel 2 according to the above-described respective embodiments has been described to have the circuit configuration based on a rolling shutter system in which electric charges are sequentially generated and accumulated per pixel row by the photodiode 61. However, the circuit configuration may be of an all-pixel simultaneous reading system (global shutter method) whereby a second transfer transistor and a second electric charge holding unit are added between the transfer transistor 62 and the FD unit 63, exposure operation is executed at all pixels inside the pixel array unit 3, electric charges are temporarily held at the second electric charge holding unit until start of reading, and reading is executed per row.

<Exemplary Substrate Configuration of Solid-State Imaging Device>

Figure 17:
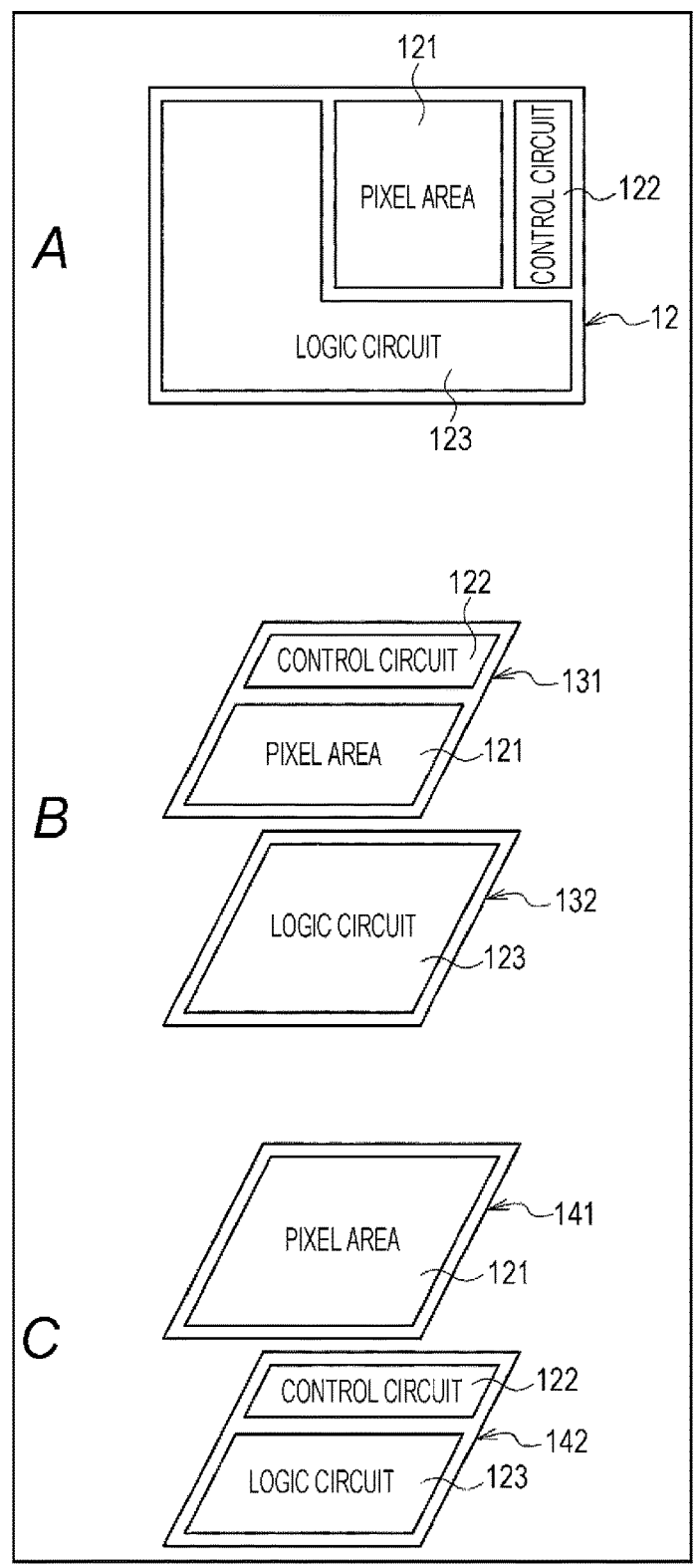
FIGS. 17A to 17C are diagrams illustrating exemplary substrate configurations of the solid-state imaging device.

As illustrated in FIG. 17A, the solid-state imaging device 1 in FIG. 1 includes one semiconductor substrate 12 on which a pixel area 121 on which the plurality of pixels 2 is arrayed, a control circuit 122 configured to control the pixel 2, and a logic circuit 123 including a signal processing circuit for a pixel signal are formed.

However, as illustrated in FIG. 17B, the solid-state imaging device 1 may have a configuration in which a first semiconductor substrate 131 formed with the pixel area 121 and the control circuit 122 and a second semiconductor substrate 132 formed with the logic circuit 123 are laminated. The first semiconductor substrate 131 and the second semiconductor substrate 132 are electrically connected by, for example, a through via or Cu—Cu metal binding.

Alternatively, as illustrated in FIG. 17C, the solid-state imaging device 1 may have a configuration in which a first semiconductor substrate 141 formed with only the pixel area 121 and a second semiconductor substrate 142 formed with the control circuit 122 and the logic circuit 123 laminated. The first semiconductor substrate 141 and the second semiconductor substrate 142 are electrically connected by, for example, the through via or Cu—Cu metal binding.

<8. Exemplary Application to Electronic Apparatus>

Application of the technology of the present disclosure is not limited to the solid-state imaging device. More specifically, the technology of the present disclosure is applicable to all of electronic apparatuses using a solid-state imaging device at an image capturing unit (photoelectric conversion unit), for example, imaging devices such as a digital still camera and a video camera, a portable terminal device having an imaging function, a copier using a solid-state imaging device at an image reading unit, and so on. The solid-state imaging device may be formed as one chip, and also may have a module-like form having an imaging function in which an imaging unit and a signal processing unit or an optical system are integrally packaged.

Figure 18:
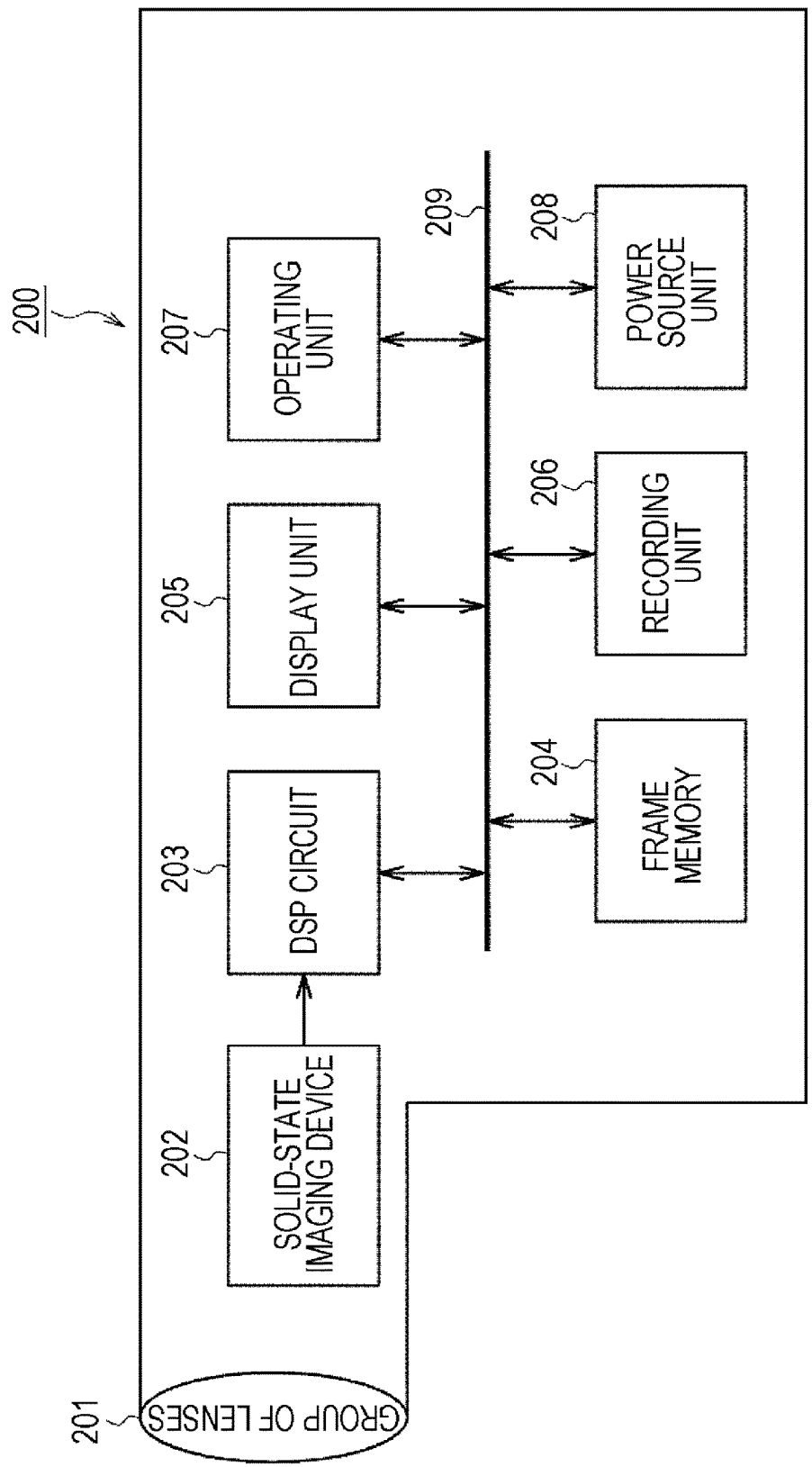
FIG. 18 is a block diagram illustrating an exemplary configuration of an imaging device as an electronic apparatus according to an embodiment of the present disclosure.

FIG. 18 is a block diagram illustrating an exemplary configuration of the imaging device as the electronic apparatus according to an embodiment of the present disclosure.

An imaging device 200 in FIG. 18 includes an optical unit 201 formed of, for example, a group of lenses, a solid-state imaging device (imaging device) 202 in which the solid-state imaging device 1 in FIG. 1 is adopted, and a Digital Signal Processor (DSP) circuit 203 which is a camera signal processing circuit. Further, the imaging device 200 also includes a frame memory 204, a display unit 205, a recording unit 206, an operating unit 207, and a power source unit 208. The DSP circuit 203, frame memory 204, display unit 205, recording unit 206, operating unit 207, and power source unit 208 are mutually connected via a bus line 209.

The optical unit 201 takes in incident light (image light) from an object and forms an image on an imaging area of the solid-state imaging device 202. The solid-state imaging device 202 converts, per pixel, a light amount of the incident light formed on the imaging area by the optical unit 201 to an electric signal, and outputs the electric signal as a pixel signal. As the solid-state imaging device 202, the solid-state imaging device 1 in FIG. 1, more specifically, the solid-state imaging device having a downsized circuit size can be used without generating any defective pixel by turning on/off connection between the two FD units 63 when the pixel 2 is used for focus detection and image generation.

The display unit 205 may be formed of, for example, a panel type display unit such as a liquid crystal panel and an organic electro luminescence (EL) panel, and configured to display a moving image or a still image imaged by the solid-state imaging device 202. The recording unit 206 records the moving image or the still image imaged by the solid-state imaging device 202 in a recoding medium such as a hard disk and a semiconductor memory.

The operating unit 207 issues an operational command relative to various kinds of functions included in the imaging device 200 in accordance with a user's operation. The power source unit 208 suitably supplies following supply targets with various kinds of power to be operation power sources of the DSP circuit 203, frame memory 204, display unit 205, recording unit 206, and operating unit 207.

As described above, by using the solid-state imaging device 1 according to the above-described embodiment as the solid-state imaging device 202, the focus detection pixels can be arranged in high density, and the image can be captured without generating a defective pixel. Therefore, quality of the captured image can be improved in the imaging device 200 such as a video camera, a digital still camera, and further a camera module for a mobile apparatus like a cell phone.

According to the above-described examples, a description has been provided for the solid-state imaging device in which a first conductivity type is the p-type, a second conductivity type is the n-type, and an electron is a signal electric charge. However, the technology of the present disclosure is applicable to a solid-state imaging device in which a positive hole is used as the signal electric charge. In other words, the above-described respective semiconductor regions may be formed of semiconductor regions having reverse conductivity types in which the first conductivity type is the n-type and the second conductivity type is the p-type.

Further, the technology according to an embodiment of the present disclosure is applicable not only to the solid-state imaging device configured to detect and capture distribution of an incident light amount of visible light as an image but also to a solid-state imaging device configured to detect and capture, as an image, the distribution of the incident light amount of, such as an infrared ray, an X-ray or a particle, and in a broad sense, to all of the solid-state imaging devices (physical amount distribution detecting devices) such as a fingerprint detection sensor configured to detect and capture distribution of other physical amounts such as pressure and capacitance as an image.

The embodiments of the present disclosure are not limited to the above-described embodiments and various kinds of modifications can be made within the scope not departing from the gist of the present disclosure.

For example, an embodiment partly or entirely combined with the above-described plurality of embodiments is adoptable.

Further, the effects recited in the present specification are merely examples and not limited thereto, and therefore, an effect other than the effects recited in the present specification may be included.

Note that the present disclosure may also have the following configurations.

(1)

A solid-state imaging device in which each of a plurality of pixels two-dimensionally arranged in a matrix shape includes a first photoelectric conversion unit and a second photoelectric conversion unit both configured to photoelectrically convert light entering via one micro lens, including:

a first reading circuit configured to read an electric charge generated at the first photoelectric conversion unit;

a second reading circuit configured to read an electric charge generated at the second photoelectric conversion unit; and a transistor configured to connect a first electric charge holding unit included in the first reading circuit to a second electric charge holding unit included in the second reading circuit.

(2)

The solid-state imaging device according to above (1), wherein the transistor connects the first electric charge holding unit to the second electric charge holding unit in the case of using the pixel as an image generating pixel, and the transistor separates the first electric charge holding unit from the second electric charge holding unit in the case of using the pixel as a focus detecting pixel.

(3)

The solid-state imaging device according to above (1) or (2), wherein in the case where the pixel is used as the focus detecting pixel, reading the electric charge of the first photoelectric conversion unit by the first reading circuit and reading the electric charge of the second photoelectric conversion unit by the second reading circuit are simultaneously executed.

(4)

The solid-state imaging device according to any one of above (1) to (3), wherein each of the first reading circuit and the second reading circuit is shared by photoelectric conversion units of one or more of other adjacent pixels.

(5)

The solid-state imaging device according to above (4), wherein each of the first reading circuit and the second reading circuit is shared by photoelectric conversion units of a plurality of other adjacent pixels.

(6)

The solid-state imaging device according to any one of above (1) to (5), wherein a control line configured to control the transistor is disposed along a column direction.

(7)

The solid-state imaging device according to any one of above (1) to (5), wherein a control line configured to control the transistor is disposed along a row direction.

(8)

The solid-state imaging device according to any one of above (1) to (7), wherein a backside illumination type is adopted.

(9)

The solid-state imaging device according to any one of above (1) to (7), wherein a front side illumination type is adopted.

(10)

The solid-state imaging device according to any one of above (1) to (9), including a circuit configuration in which the pixel executes exposure operation at the plurality of pixels simultaneously, and reading is executed per row.

(11)

The solid-state imaging device according to any one of above (1) to (10), having a configuration in which a first semiconductor substrate at least formed with a pixel area on which the plurality of pixels is arrayed and a second semiconductor substrate at least formed with a logic circuit configured to process a pixel signal output from the pixel are laminated.

(12)

A driving method for a solid-state imaging device in which each of a plurality of pixels two-dimensionally arranged in a matrix shape includes a first photoelectric conversion unit and a second photoelectric conversion unit both configured to photoelectrically convert light entering via one micro lens, the solid-state imaging device including:

a first reading circuit configured to read an electric charge generated at the first photoelectric conversion unit;

a second reading circuit configured to read an electric charge generated at the second photoelectric conversion unit; and a transistor configured to connect a first electric charge holding unit included in the first reading circuit to a second electric charge holding unit included in the second reading circuit, wherein the transistor connects the first electric charge holding unit to the second electric charge holding unit in the case of using the pixel as an image generating pixel, and the transistor separates the first electric charge holding unit from the second electric charge holding unit in the case of using the pixel as a focus detecting pixel.

(13)

An electronic apparatus including a solid-state imaging device in which each of a plurality of pixels two-dimensionally arranged in a matrix shape includes a first photoelectric conversion unit and a second photoelectric conversion unit both configured to photoelectrically convert light entering via one micro lens, the solid-state imaging device including:

a first reading circuit configured to read an electric charge generated at the first photoelectric conversion unit;

a second reading circuit configured to read an electric charge generated at the second photoelectric conversion unit; and a transistor configured to connect a first electric charge holding unit included in the first reading circuit to a second electric charge holding unit included in the second reading circuit.

REFERENCE SIGNS LIST

1 Solid-state imaging device
2 Pixel
3 Pixel array unit
12 Semiconductor substrate
61 Photodiode
62 Transfer transistor
63 FD unit
64 Reset transistor
65 Amplification transistor
66 Selecting transistor
67 FD connecting transistor
84X, 84Y FD connection control line
131 First semiconductor substrate
132 Second semiconductor substrate
141 First semiconductor substrate 142 Second semiconductor substrate
200 Imaging device
202 Solid-state imaging device

The invention claimed is:

1. A solid-state imaging device comprising a plurality of pixels two-dimensionally arranged in a matrix shape formed on a substrate, the device comprising:
a first reading circuit configured to read an electric charge generated at a first photoelectric conversion unit of a first pixel, wherein the first photoelectric conversion unit is configured to photoelectrically convert light entering via a micro lens;
a second reading circuit configured to read an electric charge generated at a second photoelectric conversion unit of the first pixel, wherein the second photoelectric conversion unit is configured to photoelectrically convert light entering via the micro lens; and
a transistor formed on a surface of the substrate, the transistor configured to connect a first electric charge holding unit included in the first reading circuit to a second electric charge holding unit included in the second reading circuit,
wherein in a focus detection operating mode:
the first electric charge holding unit is electrically separated from the second electric charge holding unit by the transistor; and
a first pixel signal from the first photoelectric conversion unit and a second pixel signal from the second photoelectric conversion unit are separately output;
wherein a phase deviation amount is calculated from a deviation between the pixel signal from the first photoelectric conversion unit and the pixel signal from the second photoelectric conversion unit; and
wherein in an image generation operating mode:
the first electric charge holding unit is electrically connected to the second electric charge holding unit by the transistor, wherein the first and second pixel signals are processed as a single pixel signal to obtain a single image signal from the first and second photoelectric conversion units.

2. The solid-state imaging device according to claim 1, wherein in the focus detection operating mode, an imaging capturing lens is adjusted based on the phase deviation amount.

3. The solid-state imaging device according to claim 1, wherein in the focus detection operating mode, a first pixel of the plurality of pixels comprises a focus detecting pixel, and the first reading circuit reads the electric charge generated at the first photoelectric conversion unit of the first pixel simultaneously with the second reading circuit reading the electric charge generated at the second photoelectric conversion unit of the first pixel.

4. The solid-state imaging device according to claim 1, wherein each of the first reading circuit and the second reading circuit is shared by photoelectric conversion units of one or more other adjacent pixels.

5. The solid-state imaging device according to claim 4, wherein each of the first reading circuit and the second reading circuit is shared by photoelectric conversion units of a plurality of other adjacent pixels.

6. The solid-state imaging device according to claim 1, wherein a control line configured to control the transistor is disposed along a column direction.

7. The solid-state imaging device according to claim 1, wherein a control line configured to control the transistor is disposed along a row direction.

8. The solid-state imaging device according to claim 1, wherein a backside illumination type is adopted.

9. The solid-state imaging device according to claim 1, wherein a front side illumination type is adopted.

10. The solid-state imaging device according to claim 1, having a circuit configuration in which an exposure operation is executed at each of the plurality of pixels simultaneously, and reading is executed per row.

11. The solid-state imaging device according to claim 1, having a configuration in which a first semiconductor substrate at least formed with a pixel area on which the plurality of pixels is arrayed and a second semiconductor substrate at least formed with a logic circuit configured to process a pixel signal output from the plurality of pixels are laminated.

12. A driving method for a solid-state imaging device comprising a plurality of pixels two-dimensionally arranged in a matrix shape formed on a substrate, the solid-state imaging device including:
a first reading circuit configured to read an electric charge generated at a first photoelectric conversion unit of a first pixel, wherein the first photoelectric conversion unit is configured to photoelectrically convert light entering via a micro lens;
a second reading circuit configured to read an electric charge generated at a second photoelectric conversion unit of the first pixel, wherein the second photoelectric conversion unit is configured to photoelectrically convert light entering via the micro lens; and
a transistor formed on a surface of the substrate, the transistor configured to connect a first electric charge holding unit included in the first reading circuit to a second electric charge holding unit included in the second reading circuit,
wherein in an image generation operating mode:
the first electric charge holding unit is electrically connected to the second electric charge holding unit by the transistor, wherein a first pixel signal from the first photoelectric conversion unit and a second pixel signal from the second photoelectric conversion unit are processed as a single pixel signal to obtain a single image signal from the first and second photoelectric conversion units; and
wherein in a focus detection operating mode:
the first electric charge holding unit is electrically separated from the second electric charge holding unit by the transistor; and
the first pixel signal from the first photoelectric conversion unit and the second pixel signal from the second photoelectric conversion unit are separately output, wherein a phase deviation amount is calculated from a deviation between the pixel signal from the first photoelectric conversion unit and the pixel signal from the second photoelectric conversion unit.

13. An electronic apparatus comprising a solid-state imaging device comprising a plurality of pixels two-dimensionally arranged in a matrix shape formed on a substrate, the solid-state imaging device including:
a first reading circuit configured to read an electric charge generated at a first photoelectric conversion unit of a first pixel, wherein the first photoelectric conversion unit is configured to photoelectrically convert light entering via a micro lens;
a second reading circuit configured to read an electric charge generated at a second photoelectric conversion unit of the first pixel, wherein the second photoelectric conversion unit is configured to photoelectrically convert light entering via the micro lens; and a transistor formed on a surface of the substrate, the transistor configured to connect a first electric charge holding unit included in the first reading circuit to a second electric charge holding unit included in the second reading circuit,
wherein in a focus detection operating mode:
the first electric charge holding unit is electrically separated from the second electric charge holding unit by the transistor; and
a first pixel signal from the first photoelectric conversion unit and a second pixel signal from the second photoelectric conversion unit are separately output;
wherein a phase deviation amount is calculated from a deviation between the pixel signal from the first photoelectric conversion unit and the pixel signal from the second photoelectric conversion unit; and
wherein in an image generation operating mode:
the first electric charge holding unit is electrically connected to the second electric charge holding unit by the transistor, wherein the first and second pixel signals are processed as a single pixel signal to obtain a single image signal from the first and second photoelectric conversion units.

* * * * *